(12) United States Patent
Ikeda et al.

(10) Patent No.: US 12,068,310 B2
(45) Date of Patent: Aug. 20, 2024

(54) SEMICONDUCTOR DEVICE

(71) Applicant: Mitsubishi Electric Corporation, Tokyo (JP)

(72) Inventors: Munenori Ikeda, Tokyo (JP); Shinya Soneda, Tokyo (JP); Kenji Harada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/124,817

(22) Filed: Dec. 17, 2020

(65) Prior Publication Data

US 2021/0305241 A1  Sep. 30, 2021

(30) Foreign Application Priority Data

Mar. 26, 2020 (JP) .................................. 2020-056271

(51) Int. Cl.
  *H01L 27/06* (2006.01)
  *H01L 21/765* (2006.01)
  (Continued)

(52) U.S. Cl.
  CPC ........ *H01L 27/0664* (2013.01); *H01L 21/765* (2013.01); *H01L 29/1095* (2013.01);
  (Continued)

(58) Field of Classification Search
  CPC .............. H01L 29/7804; H01L 29/7805; H01L 29/7302; H01L 29/7395; H01L 29/7396; H01L 29/7397
  See application file for complete search history.

(56) References Cited

U.S. PATENT DOCUMENTS

2008/0093697 A1  4/2008  Kaneda et al.
2012/0080718 A1*  4/2012  Soeno ................. H01L 29/1095
                                                    257/140
(Continued)

FOREIGN PATENT DOCUMENTS

CN    104701361 A    6/2015
CN    110164966 A    8/2019
(Continued)

OTHER PUBLICATIONS

An Office Action; "Notice of Reasons for Refusal," mailed by the Japanese Patent Office on Apr. 18, 2023, which corresponds to Japanese Patent Application No. 2020-056271 and is related to U.S. Appl. No. 17/124,817; with English language translation.

(Continued)

*Primary Examiner* — Jesse Y Miyoshi
(74) *Attorney, Agent, or Firm* — Studebaker & Brackett PC

(57) ABSTRACT

The semiconductor device according to the present application includes: a hole injection region including a hole injection layer and a semiconductor layer of a second conductivity type; a diode region including an anode layer of a second conductivity type and a cathode layer of a first conductivity type; a boundary portion semiconductor layer of a second conductivity type provided between the diode region and the hole injection region and provided on a first main surface side; a carrier injection suppression layer of a first conductivity type provided in a surface layer of the boundary portion semiconductor layer; and a semiconductor layer of a second conductivity type provided to protrude from the hole injection region on a second main surface side.

7 Claims, 34 Drawing Sheets

(51) Int. Cl.
  *H01L 29/10* (2006.01)
  *H01L 29/40* (2006.01)
  *H01L 29/66* (2006.01)
  *H01L 29/739* (2006.01)
  *H01L 29/861* (2006.01)

(52) U.S. Cl.
  CPC ...... *H01L 29/407* (2013.01); *H01L 29/66136* (2013.01); *H01L 29/66348* (2013.01); *H01L 29/7397* (2013.01); *H01L 29/8613* (2013.01)

(56) References Cited

U.S. PATENT DOCUMENTS

| | | | | |
|---|---|---|---|---|
| 2014/0084337 | A1* | 3/2014 | Matsudai | H01L 29/66348 257/140 |
| 2015/0155277 | A1 | 6/2015 | Ogura et al. | |
| 2015/0249084 | A1* | 9/2015 | Oki | H01L 27/0727 257/140 |
| 2016/0148928 | A1* | 5/2016 | Soneda | H01L 27/0727 257/77 |
| 2018/0261594 | A1* | 9/2018 | Yamano | H01L 29/0696 |
| 2019/0252374 | A1 | 8/2019 | Kanetake et al. | |
| 2019/0252534 | A1* | 8/2019 | Murakawa | H01L 29/0834 |
| 2020/0357903 | A1 | 11/2020 | Kubouchi | |

FOREIGN PATENT DOCUMENTS

| | | |
|---|---|---|
| JP | 2008-103590 A | 5/2008 |
| JP | 2015-109341 A | 6/2015 |
| JP | 2018-73911 A | 5/2018 |
| JP | 2019-140322 A | 8/2019 |
| WO | 2020/036015 A1 | 2/2020 |

OTHER PUBLICATIONS

An Office Action mailed by China National Intellectual Property Administration on Feb. 1, 2024, which corresponds to Chinese Patent Application No. 202110297220.5 and is related to U.S. Appl. No. 17/124,817; with English language translation.

* cited by examiner

F I G. 1
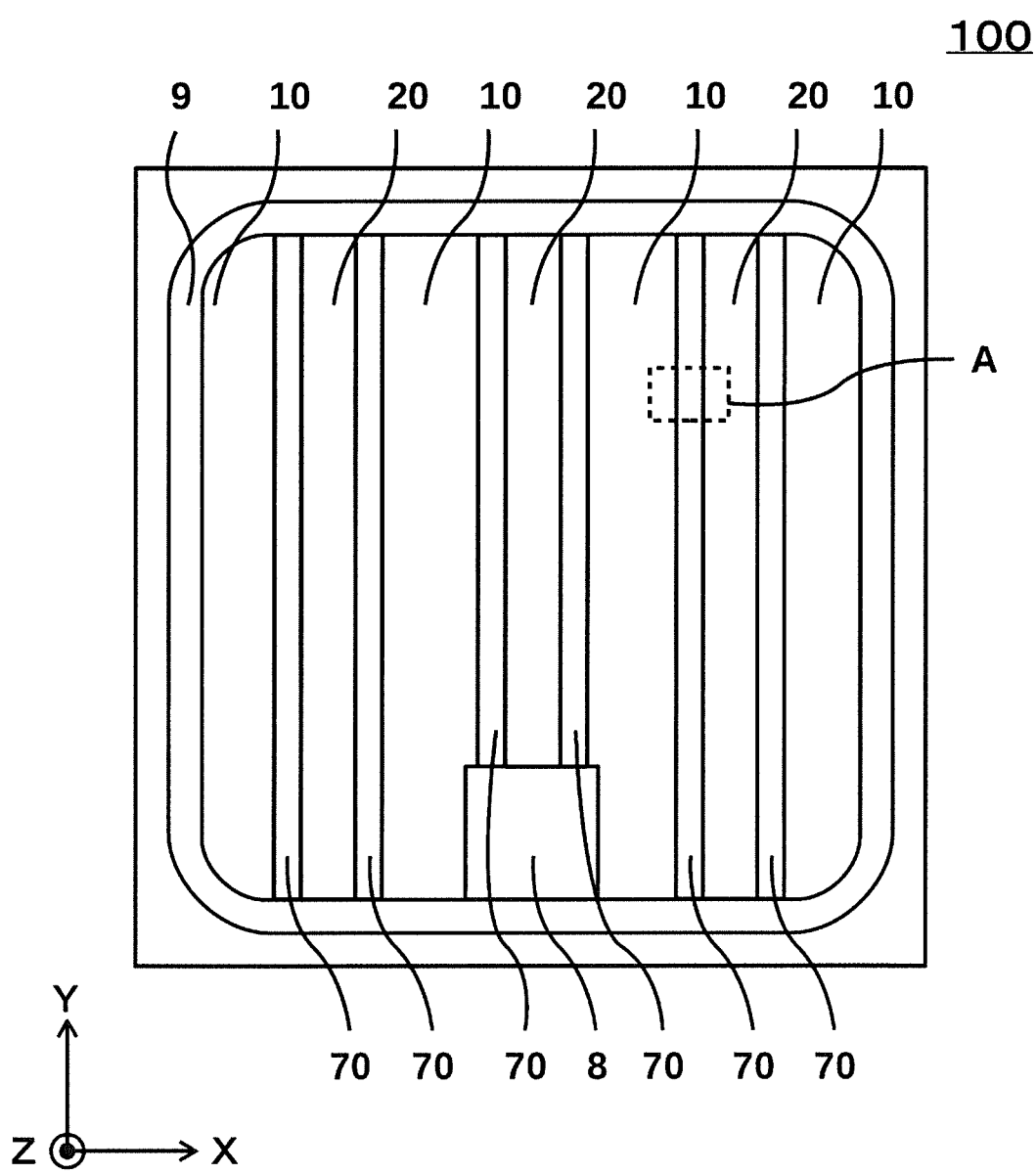

F I G. 2
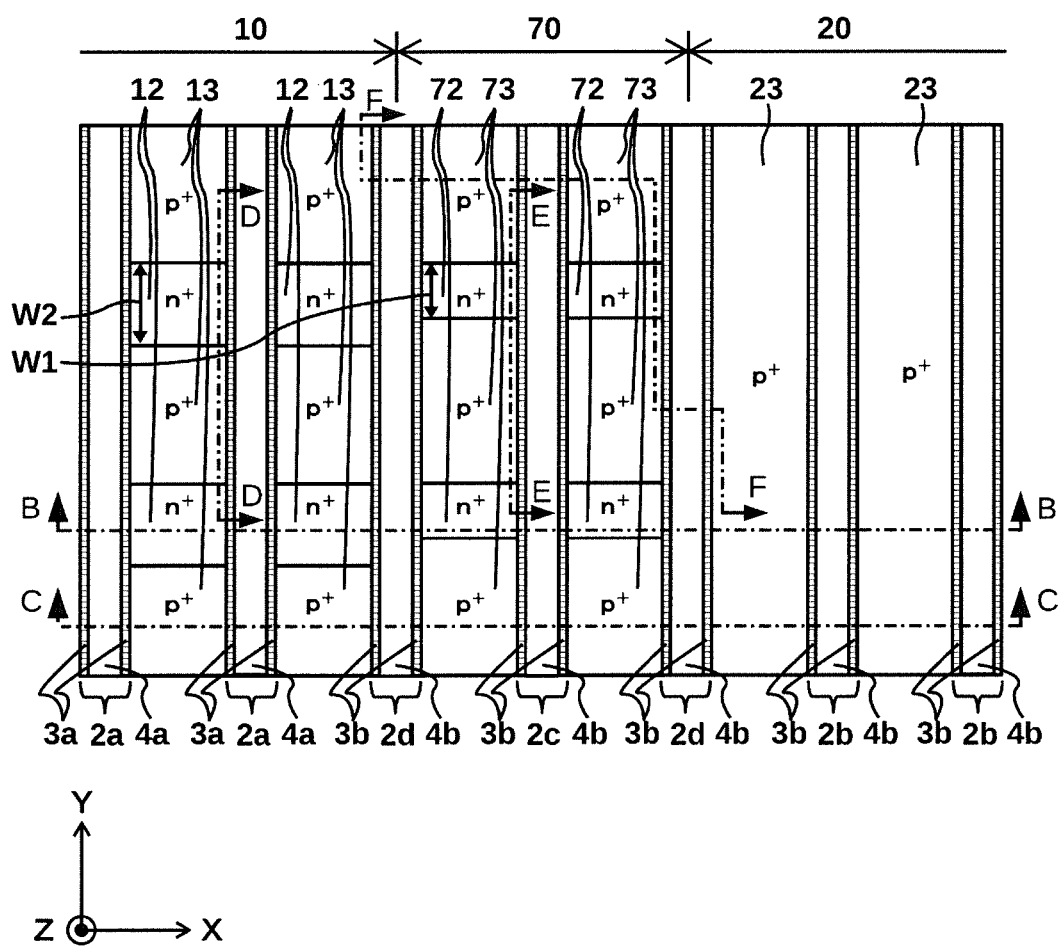

F I G. 5
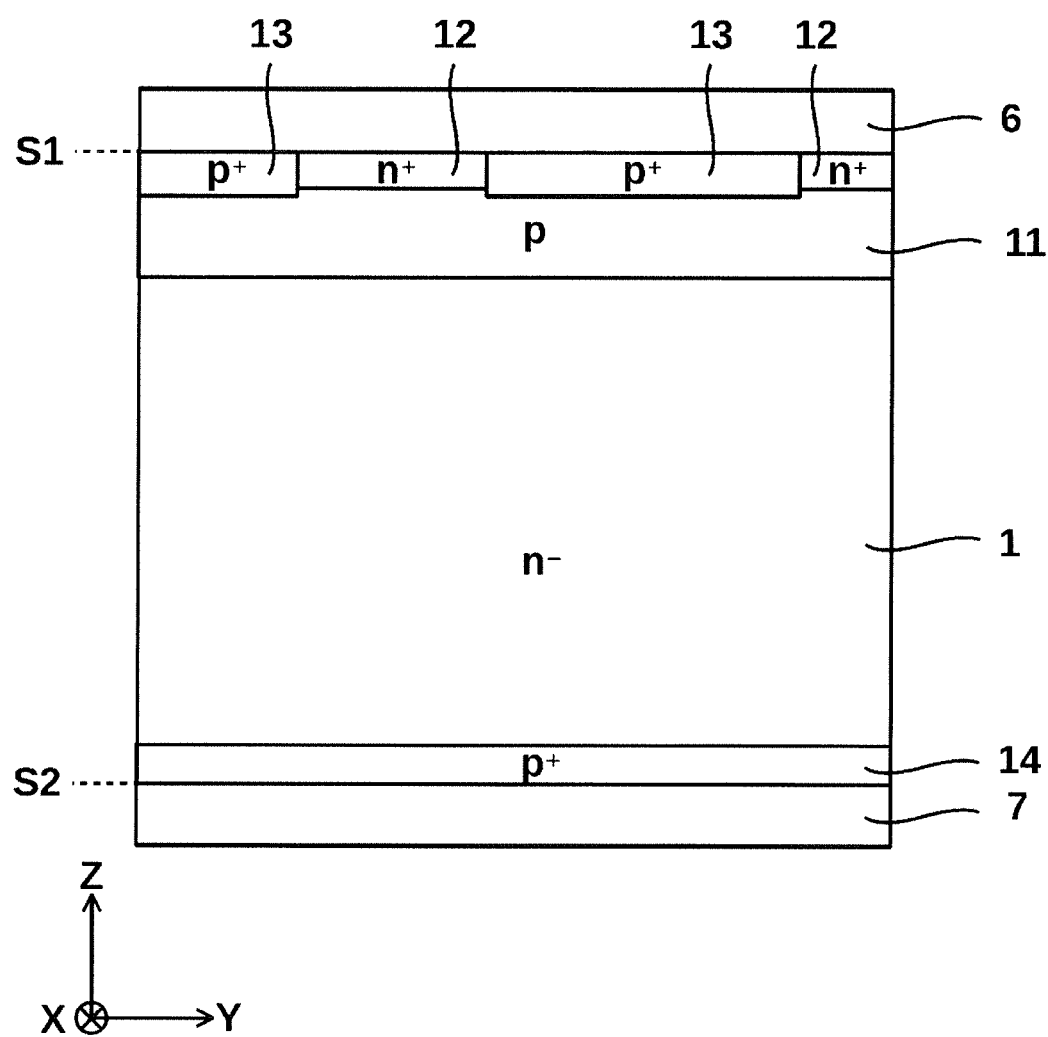

F I G. 6
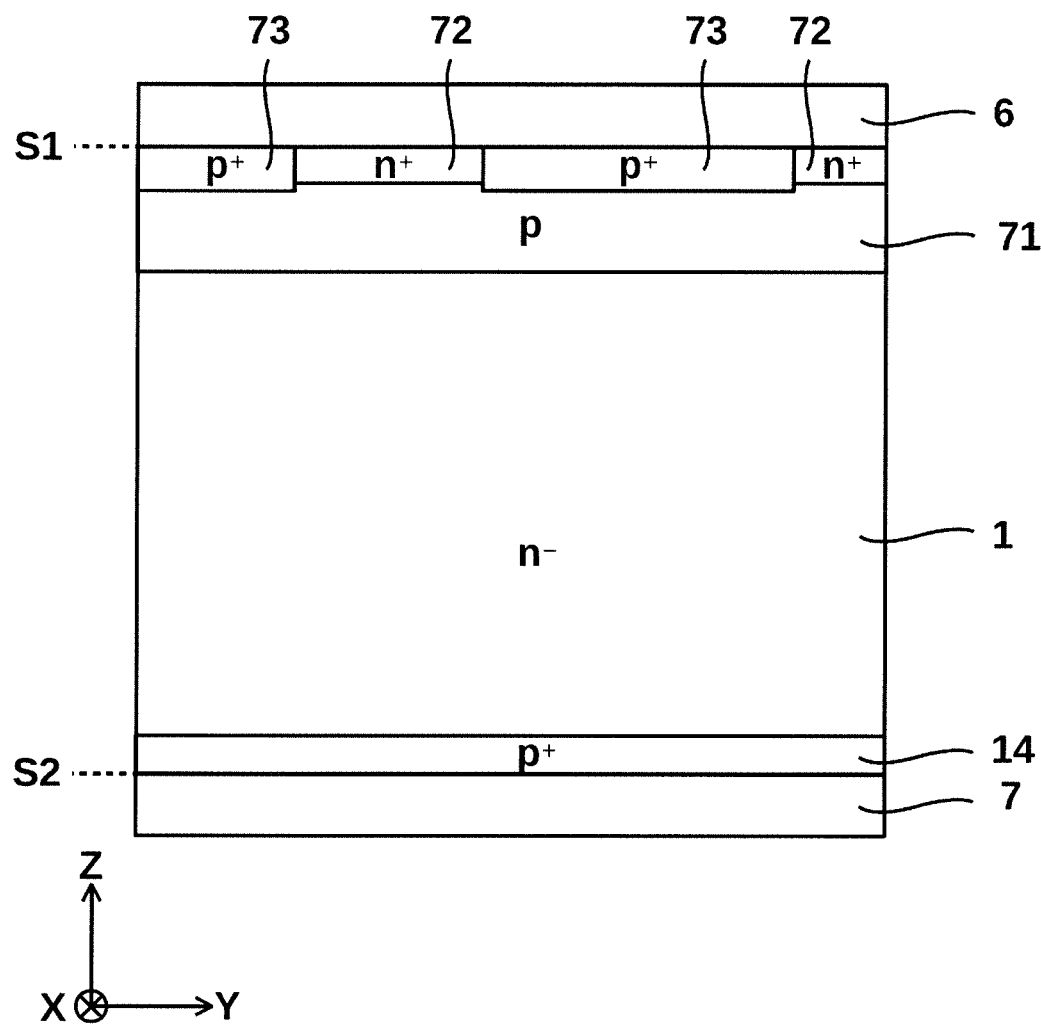

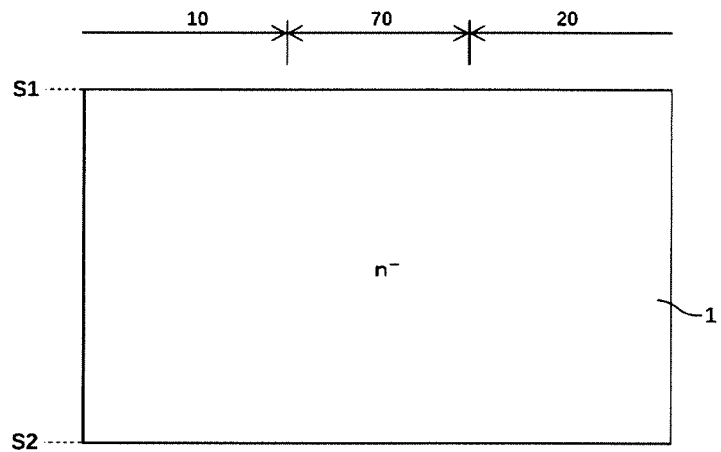
F I G. 8 A
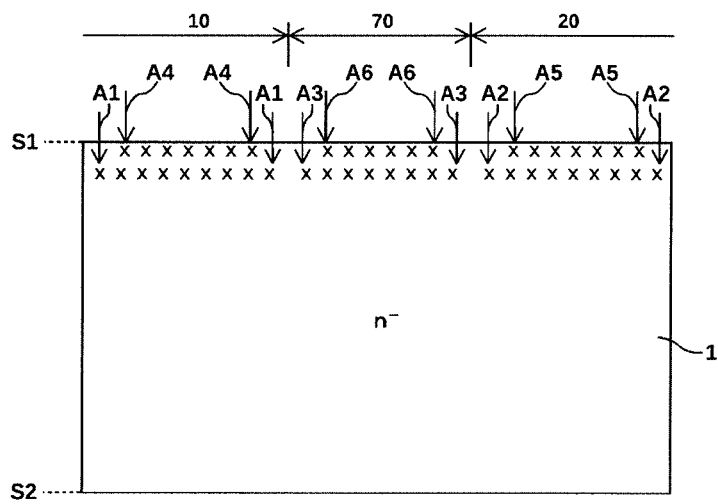
F I G. 8 B
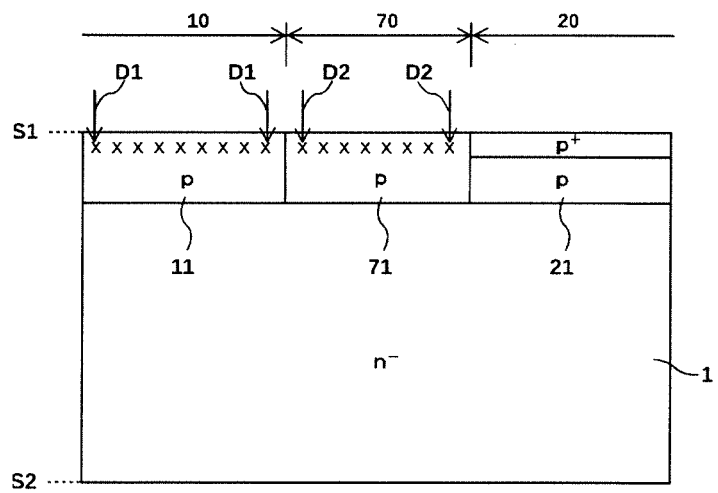
F I G. 8 C

F I G. 1 0
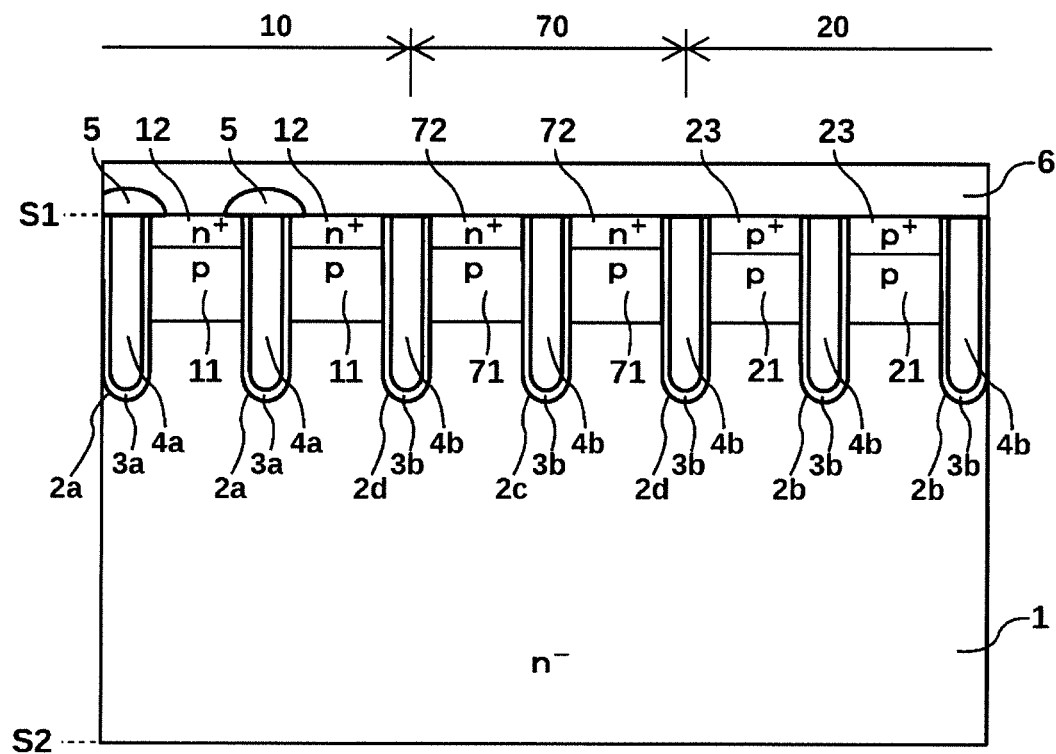

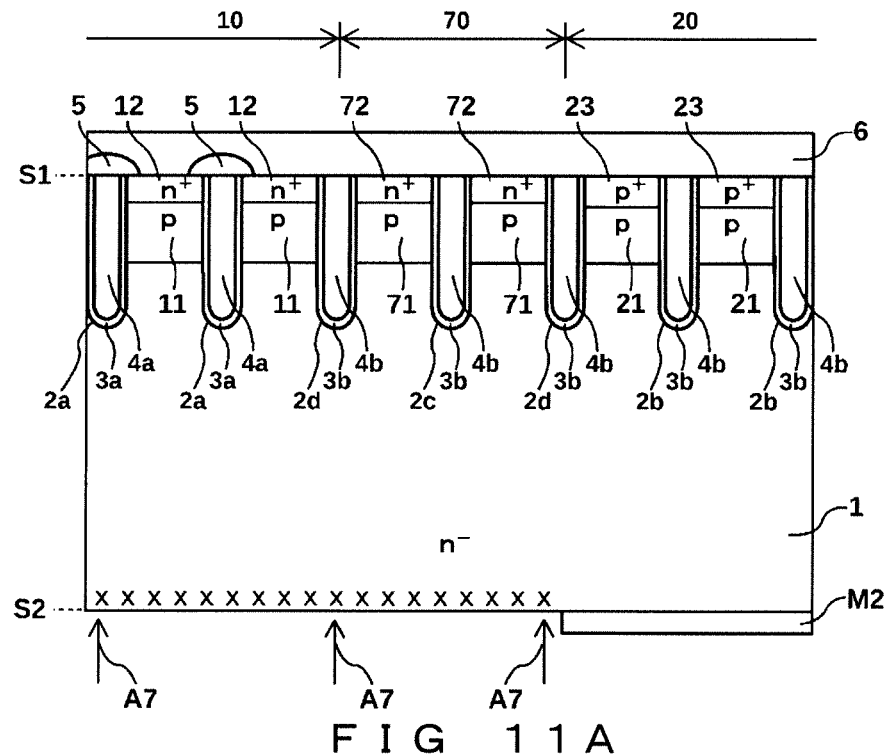
F I G. 1 1 A
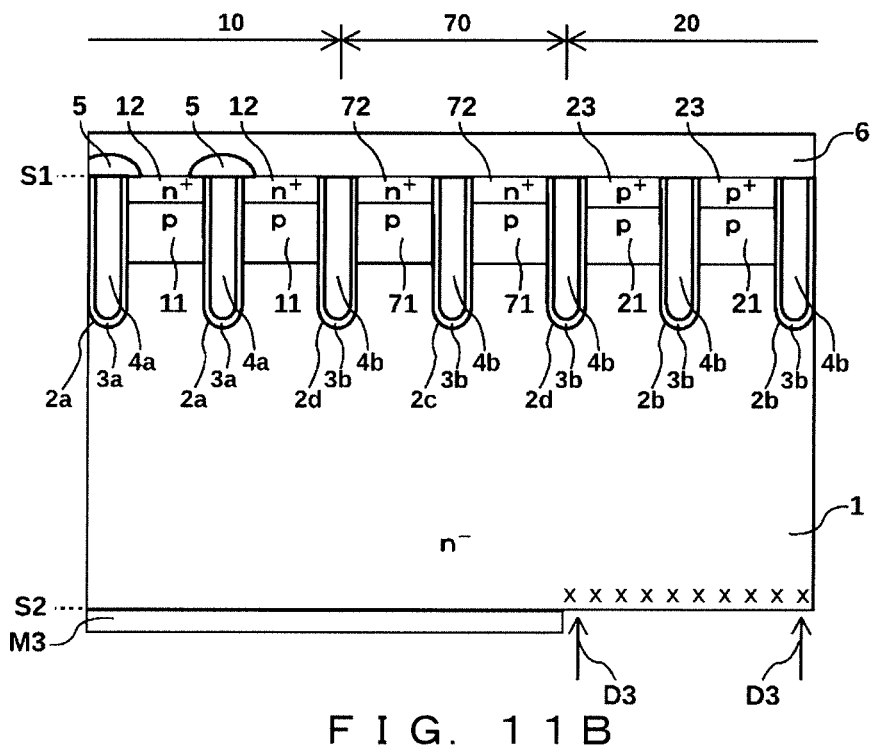
F I G. 1 1 B

F I G. 1 2
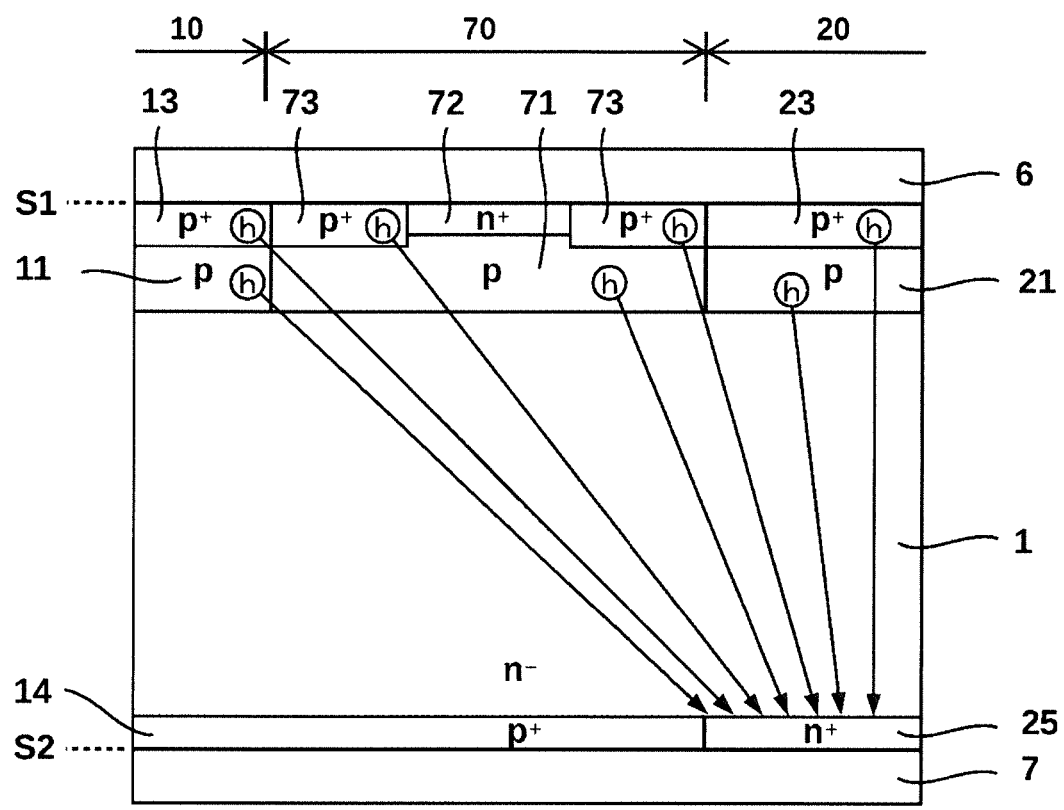

F I G 1 3
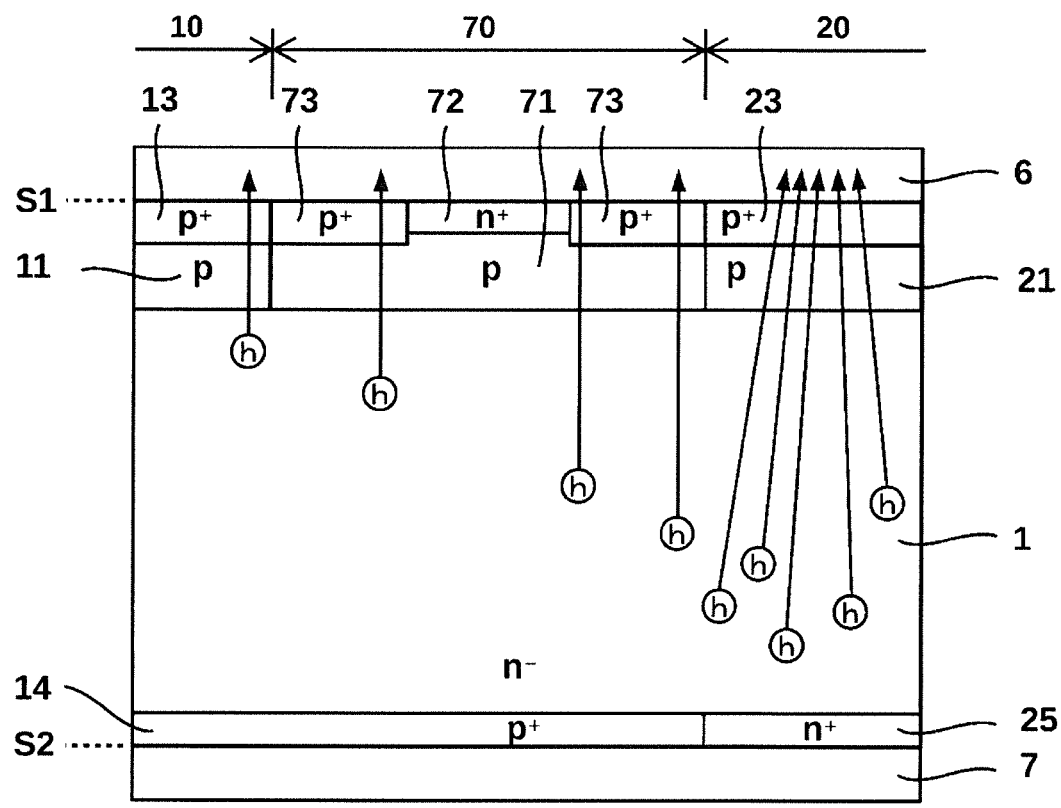

F I G. 1 5
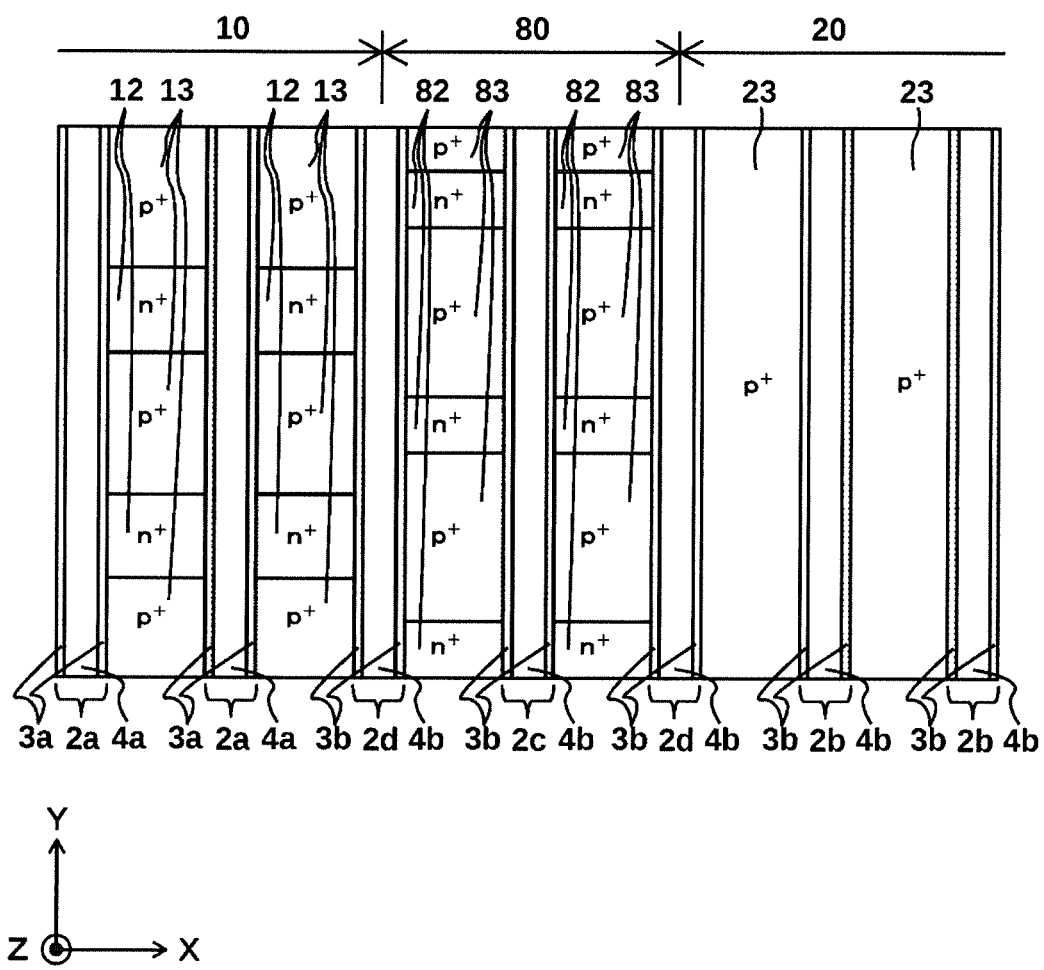

F I G. 1 8
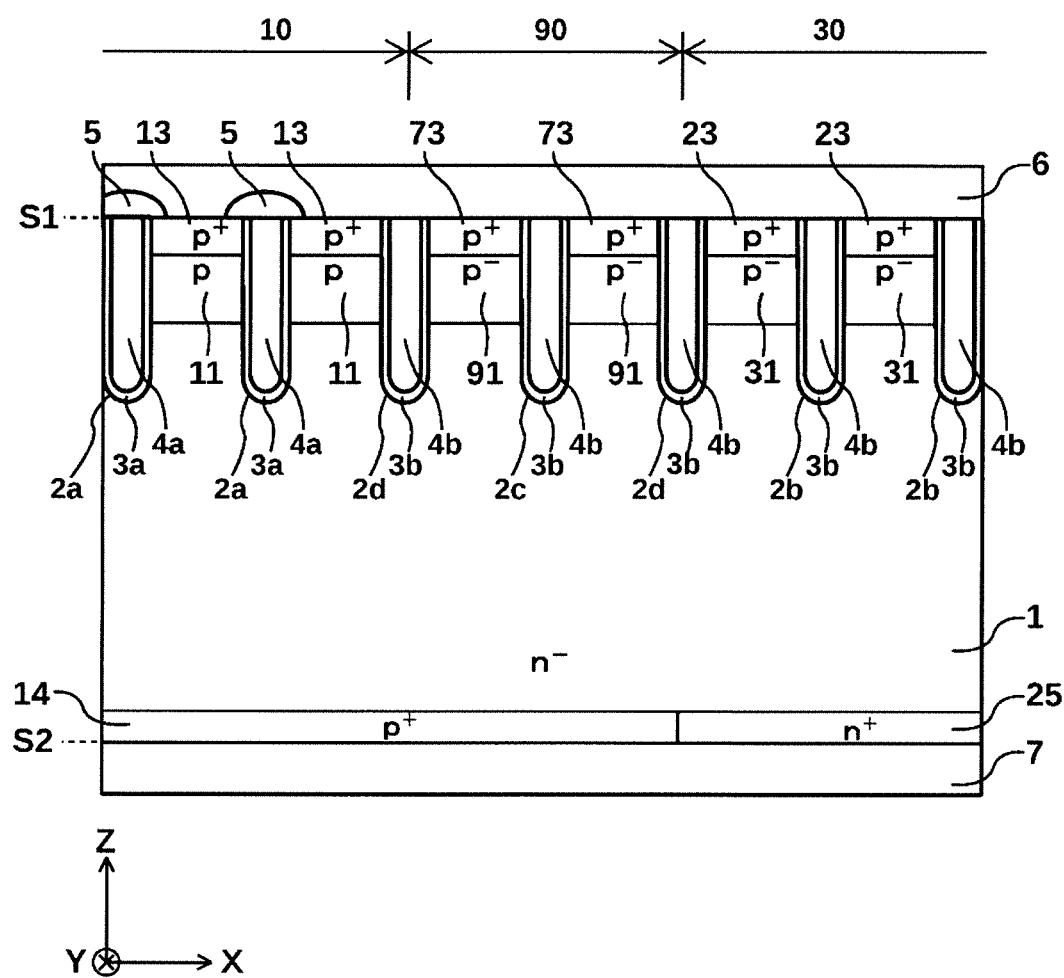

F I G. 2 5
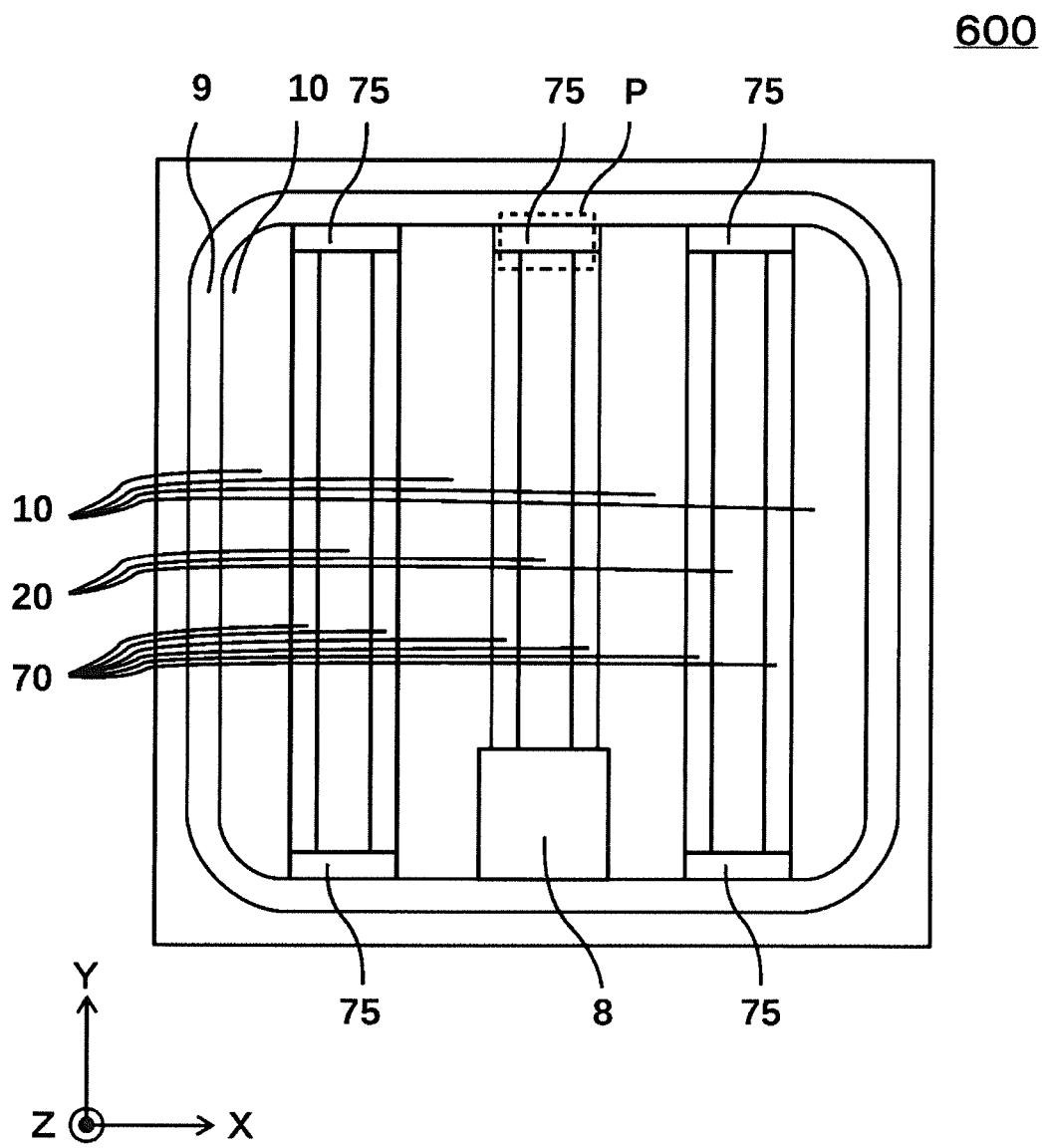

F I G. 2 7
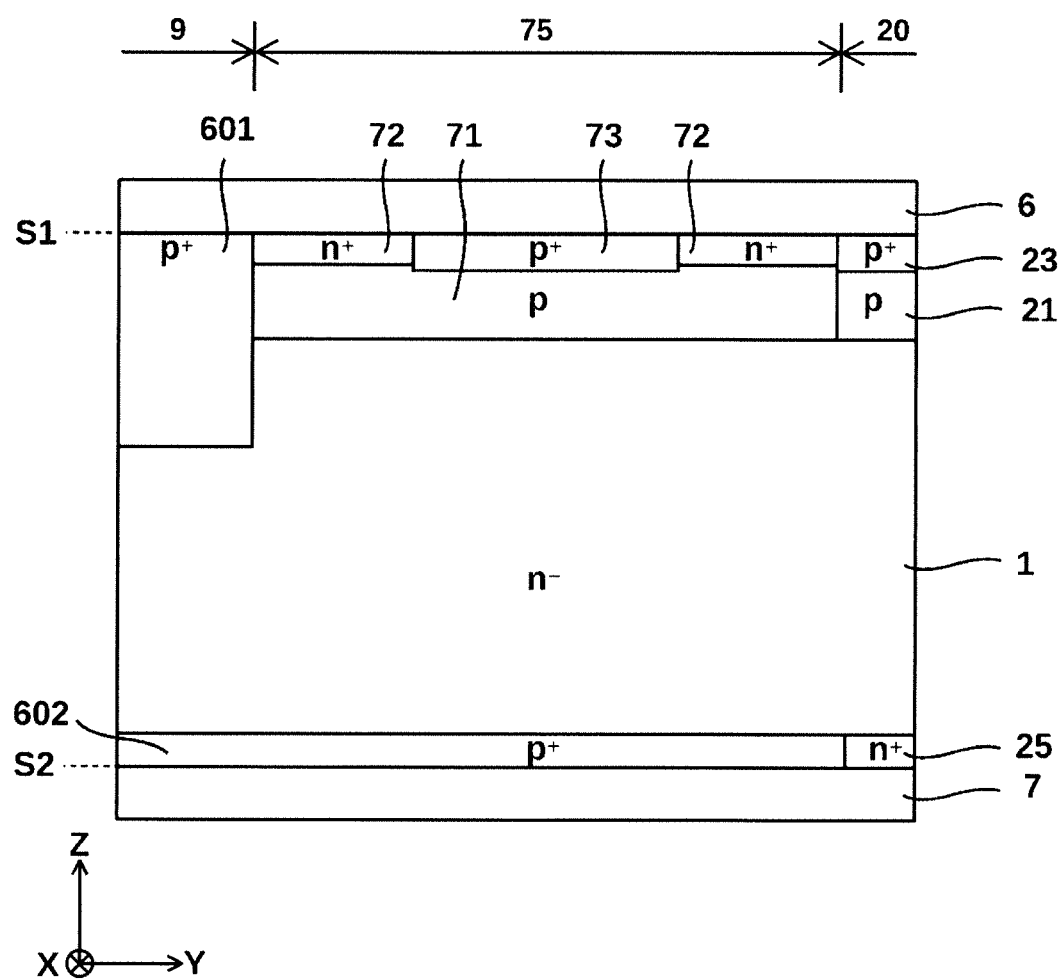

F I G. 2 8
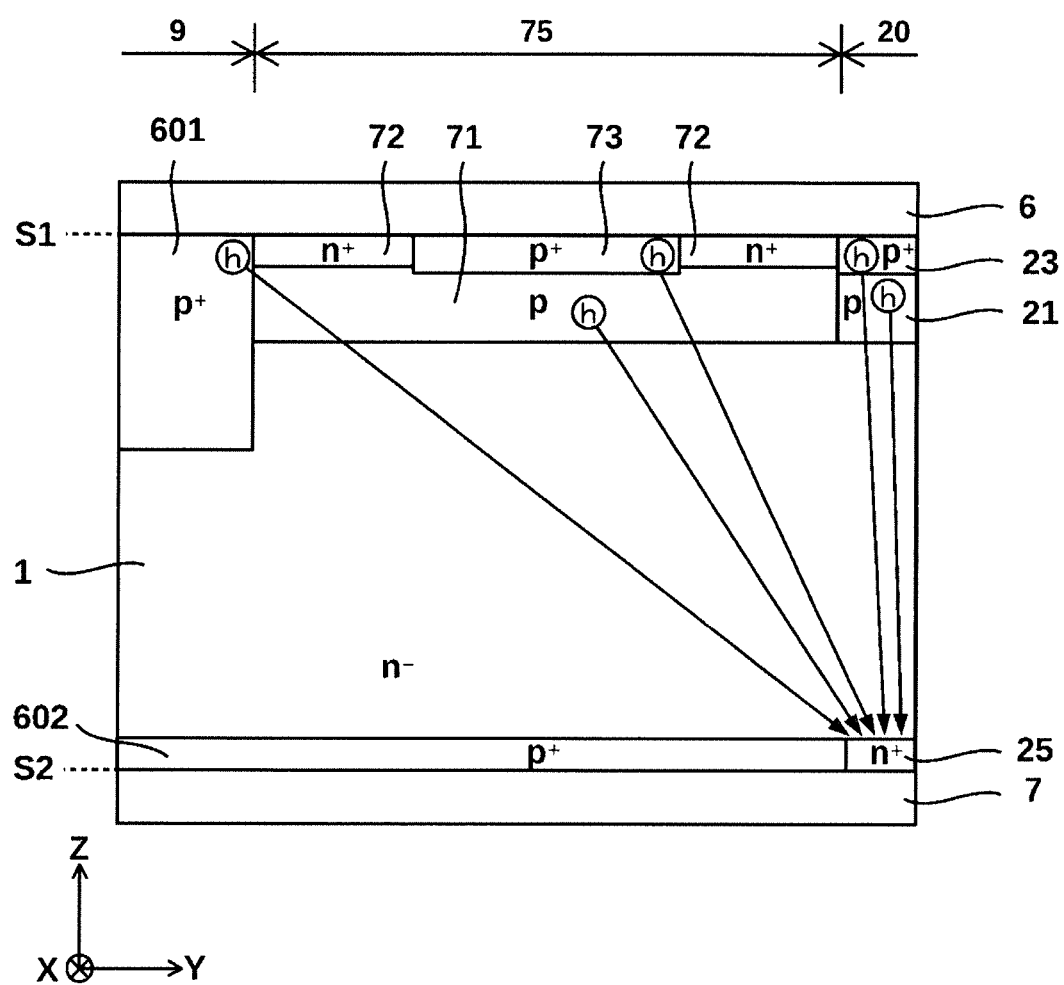

SEMICONDUCTOR DEVICE

BACKGROUND OF THE INVENTION

Field of the Invention

The present disclosure relates to a semiconductor device.

Description of the Background Art

From the viewpoint of energy saving, inverter apparatuses are used in a wide range of fields such as home appliances, electric vehicles, and railways. Most of the inverter apparatuses are configured using an insulated gate bipolar transistor (IGBT) and a diode for reflux. The insulated gate bipolar transistor and the diode are connected by wiring lines such as a wire inside the inverter apparatus.

In order to reduce the size of the inverter apparatus, a semiconductor device in which an insulated gate bipolar transistor and a diode are formed on one semiconductor substrate has been proposed (see Japanese Patent Application Laid-Open No. 2008-103590, for example).

However, in a semiconductor device in which an insulated gate bipolar transistor and a diode are formed on one semiconductor substrate as described above, since the hole injection region such as the insulated gate bipolar transistor region, the termination region, or the gate signal receiving region provided with the gate signal receiving pad, and the diode region are arranged adjacent to each other, there is a problem that holes being minority carriers flow from the hole injection region into the diode region, and the breakdown tolerance during the recovery operation is lowered.

SUMMARY

Provided is a semiconductor device in which the flow of holes from a hole injection region such as an insulated gate bipolar transistor region, a termination region, and a gate signal receiving region into a diode region is suppressed, and the breakdown tolerance during recovery operation is improved.

The semiconductor device according to the present disclosure includes a semiconductor substrate, a hole injection region, a diode region, a boundary region, and a dummy gate electrode.

The semiconductor substrate includes a drift layer of a first conductivity type between a first main surface and a second main surface facing the first main surface.

The hole injection region includes: a hole injection layer of a second conductivity type provided in a surface layer on the first main surface side of the semiconductor substrate, and a semiconductor layer of a second conductivity type provided in a surface layer on the second main surface side.

The diode region includes: an anode layer of a second conductivity type provided in a surface layer on the first main surface side of the semiconductor substrate, an anode contact layer of a second conductivity type selectively provided in a surface layer on the first main surface side of the anode layer, the anode contact layer having a higher impurity concentration than the anode layer, and a cathode layer of a first conductivity type provided in a surface layer on the second main surface side of the semiconductor substrate. The diode region has no semiconductor layer of a first conductivity type between the second main surface side end portion of the anode layer and the first main surface of the anode layer.

The boundary region includes: a boundary portion semiconductor layer of a second conductivity type provided between the diode region and the hole injection region, the boundary portion semiconductor layer provided in a surface layer on the first main surface side of the semiconductor substrate, a carrier injection suppression layer of a first conductivity type provided in a surface layer of the boundary portion semiconductor layer, a boundary portion contact layer of a second conductivity type provided in a surface layer of the boundary portion semiconductor layer, the boundary portion contact layer having a higher impurity concentration than the boundary portion semiconductor layer, and the semiconductor layer of a second conductivity type provided to protrude from the hole injection region in a surface layer on the second main surface side of the semiconductor substrate.

The dummy gate electrode is provided on the first main surface side of the semiconductor substrate between the diode region and the boundary region, the dummy gate electrode facing the boundary portion semiconductor layer and the drift layer via a gate insulating film, the dummy gate electrode to which no gate driving voltage is applied.

According to the present disclosure, providing a boundary region between a hole injection region and a diode region and providing a carrier injection suppression layer for suppressing hole injection in the boundary region makes it possible to suppress the inflow of holes into the diode region and improve the breakdown tolerance during recovery operation.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIGS. 1 and 2 are plan views each showing a semiconductor device according to a first preferred embodiment;

FIGS. 3 to 6 are cross-sectional views each showing the semiconductor device according to the first preferred embodiment;

FIGS. 8A to 11B are diagrams each showing a manufacturing process of the semiconductor device according to the first preferred embodiment;

FIG. 12 is a diagram schematically showing movement of holes during reflux operation of the semiconductor device according to the first preferred embodiment;

FIG. 13 is a diagram schematically showing movement of holes during recovery operation of the semiconductor device according to the first preferred embodiment;

FIGS. 14 and 15 are plan views each showing a semiconductor device according to a second preferred embodiment;

FIG. 18 is a cross-sectional view showing the semiconductor device according to the third preferred embodiment;

FIGS. 25 and 26 are plan views each showing a semiconductor device according to a sixth preferred embodiment;

FIG. 27 is a cross-sectional view showing the semiconductor device according to the sixth preferred embodiment;

FIG. 28 is a diagram schematically showing movement of holes during reflux operation of the semiconductor device according to the sixth preferred embodiment;

DESCRIPTION OF THE PREFERRED EMBODIMENTS

Figure 3:
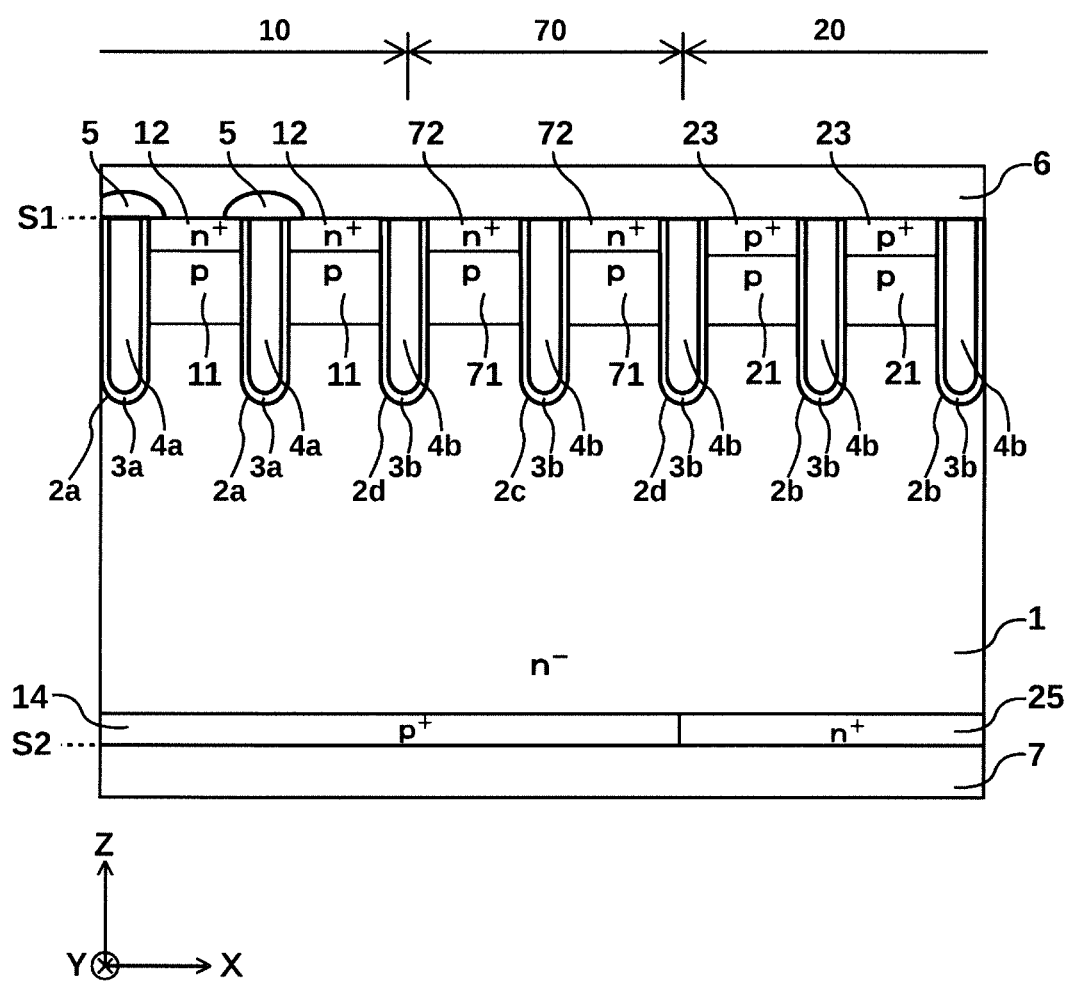

Hereinafter, preferred embodiments will be described with reference to the drawings. Since the drawings are schematically shown, the interrelationship between the size and the position can be changed. In the following description, the same or corresponding component may be denoted by the same reference numeral and repeated description may be omitted.

In addition, in the following description, terms that mean a specific position and direction such as "upper", "lower", "side", or the like may be used, but these terms are used to facilitate understanding of the contents of the preferred embodiments for convenience and do not limit the direction and position at the time of implementation.

The conductive type of the semiconductor will be described with the first conductive type as the n-type and the second conductive type as the p-type. However, these may be reversed and the first conductivity type may be p-type and the second conductivity type may be n-type. The n+ type means that the donor concentration is higher than that of the n-type, and the n– type means that the donor concentration is lower than that of the n-type. Similarly, the p+ type means that the acceptor concentration is higher than that of the p-type, and the p– type means that the acceptor concentration is lower than that of the p-type.

First Preferred Embodiment

Figure 4:
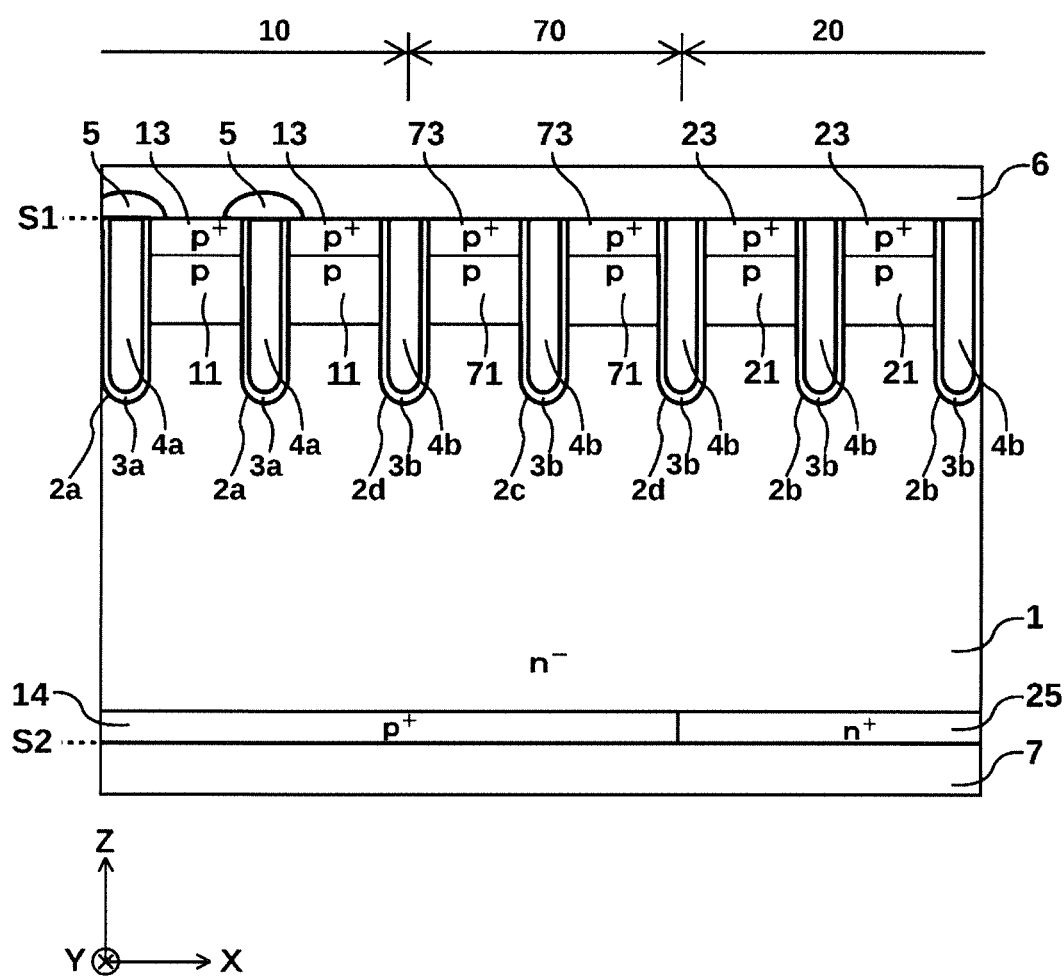

The configuration of the semiconductor device according to a first preferred embodiment will be described with reference to FIGS. 1 to 6. FIGS. 1 and 2 are plan views each showing a semiconductor device according to the first preferred embodiment. FIG. 2 is an enlarged plan view of an A part shown in FIG. 1, and is a plan view showing a structure on a first main surface side of the semiconductor substrate. In FIG. 2, the illustration of the electrode and the like provided above the first main surface of the semiconductor substrate is omitted. FIGS. 3 to 6 are cross-sectional views each showing a semiconductor device according to the first preferred embodiment. FIG. 3 is a cross-sectional view taken along line B-B shown in FIG. 2. FIG. 4 is a cross-sectional view taken along line C-C shown in FIG. 2. FIG. 5 is a cross-sectional view taken along line D-D shown in FIG. 2. FIG. 6 is a cross-sectional view taken along line E-E shown in FIG. 2. For convenience of illustration, FIGS. 1 to 6 also show XYZ orthogonal coordinate axes indicating directions.

As shown in FIG. 1, on one semiconductor substrate, the semiconductor device 100 is provided with an insulated gate bipolar transistor region 10 where the insulated gate bipolar transistor is formed, a diode region 20 where the diode is formed, and a boundary region 70 arranged between the insulated gate bipolar transistor region 10 and the diode region 20. The insulated gate bipolar transistor region 10, the diode region 20, and the boundary region 70 are stripe-shaped regions having a longitudinal direction in the Y direction of the semiconductor device 100, and the insulated gate bipolar transistor region 10, the diode region 20, and the boundary region 70 are provided side by side in the X direction of the semiconductor device 100. The insulated gate bipolar transistor region 10, the diode region 20, and the boundary region 70 are arranged in the center of the semiconductor device 100 in a plan view.

The semiconductor device 100 is provided with a gate signal receiving region 8. The gate signal receiving region 8 is a region in which a gate signal receiving pad for receiving an electric signal being a gate driving voltage from the outside is arranged. A gate signal receiving pad (not shown) is provided on the first main surface of the gate signal receiving region 8, and an external electric signal is transmitted to the insulated gate bipolar transistor region 10 via the gate signal receiving pad. The insulated gate bipolar transistor region 10 switches between an energized state and a non-energized state according to the transmitted electric signal. The gate signal receiving region 8 is arranged near the insulated gate bipolar transistor region 10. Arranging the gate signal receiving region 8 near the insulated gate bipolar transistor region 10 makes it possible to prevent noise from being mixed in the electric signal and prevent malfunction of the insulated gate bipolar transistor region 10. A wiring line for receiving an external electric signal is connected to the gate signal receiving pad. For the wiring line, for example, a wire, a lead electrode, or the like may be used.

In FIG. 1, the gate signal receiving region 8 is rectangular, and its three sides are arranged adjacent to the insulated gate bipolar transistor region 10, the diode region 20, and the boundary region 70, but the arrangement of the gate signal receiving region 8 is not limited to this. The gate signal receiving region 8 may be arranged in a region surrounded by the termination region 9 in a plan view.

The termination region 9 is a region for maintaining the withstand voltage. In a plan view, the termination region 9 is provided to surround the insulated gate bipolar transistor region 10, the diode region 20, the boundary region 70, and the gate signal receiving region 8. The termination region 9 is provided adjacent to each region of the insulated gate bipolar transistor region 10, the diode region 20, and the boundary region 70, and is provided between each region and the outer edge of the semiconductor substrate. In order to maintain the withstand voltage of the semiconductor device 100, the termination region 9 is provided with a withstand voltage holding structure such as the Field Limiting Ring (FLR) or the REduced SURface Field (RESURF).

As shown in FIG. 2, a plurality of trenches 2a are provided on the front side of the insulated gate bipolar transistor region 10, a plurality of trenches 2b are provided on the front side of the diode region 20, one trench 2c is provided in the boundary region 70, and one trench 2d is provided at each of the boundary between the insulated gate bipolar transistor region 10 and the boundary region 70 and the boundary between the diode region 20 and the boundary region 70. As shown in FIG. 2, since the trench 2d, each provided at the boundary between the insulated gate bipolar transistor region 10 and the boundary region 70 and the boundary between the diode region 20 and the boundary region 70, is included also in the boundary region 70, the boundary region includes a total of three trenches including one trench 2c and two trenches 2d. The trenches 2a, 2b, 2c, and 2d are grooves formed on the first main surface side of the semiconductor substrate by etching technology or the like. A plurality of trenches 2a, 2b, 2c, and 2d are arranged side by side in the X direction and have a longitudinal direction in the Y direction. A gate insulating film 3a is provided on the side wall of the trench 2a. A gate insulating film 3b is provided on the side walls of the trench 2b, the trench 2c, and the trench 2d. A conductive gate electrode 4a is provided inside the gate insulating films 3a of the trench 2a, and a conductive gate electrode 4b is provided inside the gate insulating films 3b of the trench 2b, the trench 2c, and the trench 2d. The gate electrode 4a and the gate electrode 4b have a longitudinal direction in the Y direction, and a plurality of the gate electrodes 4a and the gate electrodes 4b are provided side by side in the X direction.

Since the trenches 2d are arranged at both ends of the boundary region 70 in the X direction, two trenches 2d are arranged for one boundary region 70. On the other hand, the number of trenches 2c arranged between the two trenches 2d may be optionally set. In the X direction, when the boundary region 70 is to be expanded, two or more trenches 2c may be arranged between the two trenches 2d, and when the boundary region 70 is to be reduced, the trench 2c does not have to be arranged between the two trenches 2d. When the trench 2c is not arranged, the structure has only to be such that the two trenches 2d are arranged adjacent to each other.

In the insulated gate bipolar transistor region 10, in the surface layer of the semiconductor substrate between the trenches 2a adjacent to each other and the surface layer of the semiconductor substrate between the trenches 2a and 2d adjacent to each other, an n-type emitter layer 12 having a higher donor concentration than the drift layer (not shown in FIG. 2) and a p-type base contact layer 13 having a higher acceptor concentration than the base layer (not shown in FIG. 2) are provided. The emitter layer 12 is in contact with the gate insulating film 3a in the X direction. The emitter layer 12 has a longitudinal direction in the X direction and a lateral direction in the Y direction.

In the diode region 20, in the surface layer of the semiconductor substrate between the trenches 2d and 2b adjacent to each other and the surface layer of the semiconductor substrate between the trenches 2b adjacent to each other, a p-type anode contact layer 23 having a higher acceptor concentration than the anode layer (not shown in FIG. 2) is provided.

In the boundary region 70, in the surface layer of the semiconductor substrate between the trenches 2d and 2c adjacent to each other, an n-type carrier injection suppression layer 72 having a higher donor concentration than the drift layer (not shown in FIG. 2), and a p-type boundary portion contact layer 73 having a higher acceptor concentration than the boundary portion semiconductor layer (not shown in FIG. 2) are provided. The boundary portion contact layer 73 is in contact with the gate insulating film 3b in the X direction. The boundary portion contact layer 73 has a longitudinal direction in the X direction and a lateral direction in the Y direction.

The width in the lateral direction of the carrier injection suppression layer 72, that is, the width W1 of the carrier injection suppression layer 72 in the Y direction is desirably the width in the lateral direction of the emitter layer 12, that is, the width not more than the width W2 of the emitter layer 12 in the Y direction. When the insulated gate bipolar transistor region 10 changes from the energized state to the non-energized state, providing the carrier injection suppression layer 72 leads to a concern that latch-up will occur directly under the carrier injection suppression layer 72 and the current breaking capability will be reduced. However, when the width in the lateral direction of each of the carrier injection suppression layer 72 and the emitter layer 12 is set to the width satisfying the above relationship, the risk of latch-up occurring directly under the carrier injection suppression layer 72 can be reduced to be not more than the risk of latch-up occurring directly under the emitter layer 12. However, if the current breaking capability can be kept sufficiently high, the width in the lateral direction of each of the carrier injection suppression layer 72 and the emitter layer 12 does not have to satisfy the above-described relationship.

As shown in FIG. 3, the insulated gate bipolar transistor region 10, the diode region 20, and the boundary region 70 are provided on a common semiconductor substrate. The semiconductor substrate is, for example, a substrate made of silicon. The semiconductor substrate has a first main surface S1 on the positive side in the Z direction, and has a second main surface S2 facing the first main surface on the negative side in the Z direction from the first main surface S1. The X and Y directions are along the first main surface S1, and the Z direction is orthogonal to the first main surface S1. The semiconductor substrate includes a drift layer 1 between the first main surface S1 and the second main surface S2. The drift layer 1 is provided over the insulated gate bipolar transistor region 10, the diode region 20, and the boundary region 70. The drift layer 1 is a semiconductor layer having, for example, arsenic or phosphorus as a donor, and the concentration of the donor is $1.0E+12$ dm$^3$ to $1.0E+16$/cm$^3$.

The insulated gate bipolar transistor region 10 is provided with a p-type base layer 11 on the first main surface S1 side. An emitter layer 12 is provided in the surface layer of the base layer 11. The emitter layer 12 is a semiconductor layer having, for example, arsenic or phosphorus as a donor, and the concentration of the donor is $1.0E+17$/cm$^3$ to $1.0E+20$/cm$^3$. The base layer 11 is a semiconductor layer having, for example, boron or aluminum as an acceptor, and the concentration of the acceptor is $1.0E+12$ dm$^3$ to $1.0E+18$/cm$^3$.

On the first main surface S1 side of the insulated gate bipolar transistor region 10, a trench 2a is provided to reach the drift layer 1 through the emitter layer 12 and the base layer 11. The gate electrode 4a faces the emitter layer 12, the base layer 11, and the drift layer 1 via the gate insulating film 3a. A first electrode 6 is provided on the positive side in the Z direction of the gate electrode 4a via an interlayer insulating film 5. The gate electrode 4a is electrically insulated from the first electrode 6 by the interlayer insulating film 5. The gate electrode 4a is electrically connected to the gate signal receiving pad shown in FIG. 2, receives an electric signal via the gate signal receiving pad, and is controlled so that the voltage is raised or lowered by the electric signal. The gate electrode 4a is what is called an active gate electrode.

When a positive voltage is applied to the gate electrode 4*a*, an n-type channel (not shown) is formed at a position in contact with the gate insulating film 3*a* of the base layer 11. Since the emitter layer 12 is in contact with the gate insulating film 3*a*, the emitter layer 12 and the drift layer 1 are connected by an n-type channel, and the insulated gate bipolar transistor region 10 is switched to an energized state. When a positive voltage is not applied to the gate electrode 4*a*, the n-type channel is not formed in the base layer 11, so that the insulated gate bipolar transistor region 10 is switched to the non-energized state. The electrical connection between the gate electrode 4*a* and the gate signal receiving pad is connected by providing a wiring line (not shown) such as aluminum on the first main surface S1 side in another cross section.

The first electrode 6 is made of, for example, aluminum or an aluminum alloy. The first electrode 6 is provided on the positive side in the Z direction of the emitter layer 12, and is electrically connected to the emitter layer 12. Aluminum and aluminum alloys are metals having low contact resistance with the p-type semiconductor layer and high contact resistance with the n-type semiconductor layer. Therefore, when the first electrode 6 is made of aluminum or an aluminum alloy, instead of directly connecting the first electrode 6 to the n-type emitter layer 12, titanium having low contact resistance with the n-type semiconductor layer is caused to be in contact with the emitter layer 12, and the emitter layer 12 and the first electrode 6 may be electrically connected to each other via titanium.

The insulated gate bipolar transistor region 10 is provided with a p-type collector layer 14 having a higher acceptor concentration than the base layer 11 on the second main surface S2 side. The collector layer 14 is a semiconductor layer having, for example, boron or aluminum as an acceptor, and the concentration of the acceptor is $1.0E+16/cm^3$ to $1.0E+20/cm^3$. A second electrode 7 is provided on the negative side in the Z direction of the collector layer 14, and the collector layer 14 and the second electrode 7 are electrically connected to each other. The second electrode 7 is made of, for example, aluminum or an aluminum alloy.

The diode region 20 is provided with an anode layer 21 on the first main surface S1 side. The anode layer 21 is a semiconductor layer having, for example, boron or aluminum as an acceptor, and the concentration of the acceptor is $1.0E+12\ dm^3$ to $1.0E+18/cm^3$.

A trench 2*b* is provided on the first main surface S1 side of the diode region 20. The trench 2*b* is provided to reach the drift layer 1 through the anode contact layer 23 and the anode layer 21. The gate electrode 4*b* faces the anode contact layer 23, the anode layer 21, and the drift layer 1 via the gate insulating film 3*b*. The first electrode 6 is provided on the positive side in the Z direction of the gate electrode 4*b*. The gate electrode 4*b* and the first electrode 6 are electrically connected. Unlike the gate electrode 4*a*, the gate electrode 4*b* is not electrically connected to the gate signal receiving pad, and the voltage does not rise or fall due to the electric signal applied to the gate signal receiving pad. The first electrode 6 is provided on the positive side in the Z direction of the anode contact layer 23, and is electrically connected to the anode contact layer 23. The gate electrode 4*b* is a dummy gate electrode to which what is called a gate driving voltage is not applied.

The diode region 20 is provided with an n-type cathode layer 25 having a higher donor concentration than the drift layer 1 on the second main surface S2 side. The cathode layer 25 is a semiconductor layer having, for example, arsenic or phosphorus as a donor, and the concentration of the donor is $1.0E+16/cm^3$ to $1.0E+20/cm^3$. A second electrode 7 is provided on the negative side in the Z direction of the cathode layer 25. The second electrode 7 is electrically connected to the cathode layer 25.

The boundary region 70 is provided with a p-type boundary portion semiconductor layer 71 on the first main surface S1 side. The boundary portion semiconductor layer 71 is a semiconductor layer having, for example, boron or aluminum as an acceptor, and the concentration of the acceptor is $1.0E+12\ dm^3$ to $1.0E+18/cm^3$.

A trench 2*c* is provided on the first main surface S1 side of the boundary region 70. The trench 2*c* is provided to reach the drift layer 1 through the carrier injection suppression layer 72 and the boundary portion semiconductor layer 71. The gate electrode 4*b* faces the carrier injection suppression layer 72, the boundary portion semiconductor layer 71, and the drift layer 1 via the gate insulating film 3*b*. The first electrode 6 is provided on the positive side in the Z direction of the gate electrode 4*b*. The gate electrode 4*b* and the first electrode 6 are electrically connected. The gate electrode 4*b* is a dummy gate electrode to which what is called a gate driving voltage is not applied. The first electrode 6 is provided on the positive side in the Z direction of the carrier injection suppression layer 72, and is electrically connected to the carrier injection suppression layer 72.

The boundary region 70 includes a collector layer 14 provided to protrude from the insulated gate bipolar transistor region 10 in the surface layer on the second main surface side. A second electrode 7 is provided on the negative side in the Z direction of the collector layer 14. The second electrode 7 is electrically connected to the collector layer 14.

A trench 2*d* is provided on the first main surface S1 side of the boundary between the insulated gate bipolar transistor region 10 and the boundary region 70. The trench 2*d* at the boundary between the insulated gate bipolar transistor region 10 and the boundary region 70 is provided to reach the drift layer 1 through the emitter layer 12, the carrier injection suppression layer 72, the base layer 11, and the boundary portion semiconductor layer 71, and a gate electrode 4*b* being a dummy gate electrode is arranged inside the trench 2*d*.

A trench 2*d* is provided on the first main surface S1 side of the boundary between the diode region 20 and the boundary region 70. The trench 2*d* at the boundary between the diode region 20 and the boundary region 70 is provided to reach the drift layer 1 through the anode contact layer 23, the anode layer 21, the carrier injection suppression layer 72, and the boundary portion semiconductor layer 71, and a gate electrode 4*b* being a dummy gate electrode is arranged inside the trench 2*d*.

As shown in FIGS. 2 and 3, an n-type carrier injection suppression layer 72 is provided in the surface layer of the boundary portion semiconductor layer 71 of the boundary region 70, but an n-type semiconductor layer is not provided in the surface layer of the anode layer 21 of the diode region 20. The diode region 20 has a structure in which there is no n-type semiconductor layer between the end portion on the second main surface S2 side of the anode layer 21 and the first main surface S1.

As shown in FIG. 4, the insulated gate bipolar transistor region 10 is provided with a base contact layer 13 in the surface layer of the base layer 11. The base contact layer 13 is a semiconductor layer having, for example, boron or aluminum as an acceptor, and the concentration of the acceptor is $1.0E+15\ dm^3$ to $1.0E+18/cm^3$. The base contact layer 13 is electrically connected to the first electrode 6.

The boundary region 70 is provided with a boundary portion contact layer 73 in the surface layer of the boundary portion semiconductor layer 71. The boundary portion contact layer 73 is a semiconductor layer having, for example, boron or aluminum as an acceptor, and the concentration of the acceptor is $1.0E+15$ dm$^3$ to $1.0E+18/$cm$^3$. The boundary portion contact layer 73 is electrically connected to the first electrode 6.

As shown in FIG. 5, each of the emitter layer 12 and the base contact layer 13 is selectively provided in the surface layer of the base layer 11. The emitter layer 12 and the base contact layer 13 are semiconductor layers having a thickness in the Z direction, and the base contact layer 13 is a semiconductor layer having a larger thickness than the emitter layer 12. Setting the base contact layer 13 as a semiconductor layer having such a thickness makes it possible to prevent destruction due to latch-up when the insulated gate bipolar transistor region 10 is switched from the energized state to the non-energized state.

As shown in FIG. 6, each of the carrier injection suppression layer 72 and the boundary portion contact layer 73 is selectively provided in the surface layer of the boundary portion semiconductor layer 71. The carrier injection suppression layer 72 and the boundary portion contact layer 73 are semiconductor layers having a thickness in the Z direction, and the boundary portion contact layer 73 is a semiconductor layer having a thickness larger than that of the carrier injection suppression layer 72. Setting the boundary portion contact layer 73 as a semiconductor layer having such a thickness makes it possible to prevent destruction due to latch-up when the insulated gate bipolar transistor region 10 is switched from the energized state to the non-energized state.

Figure 7:
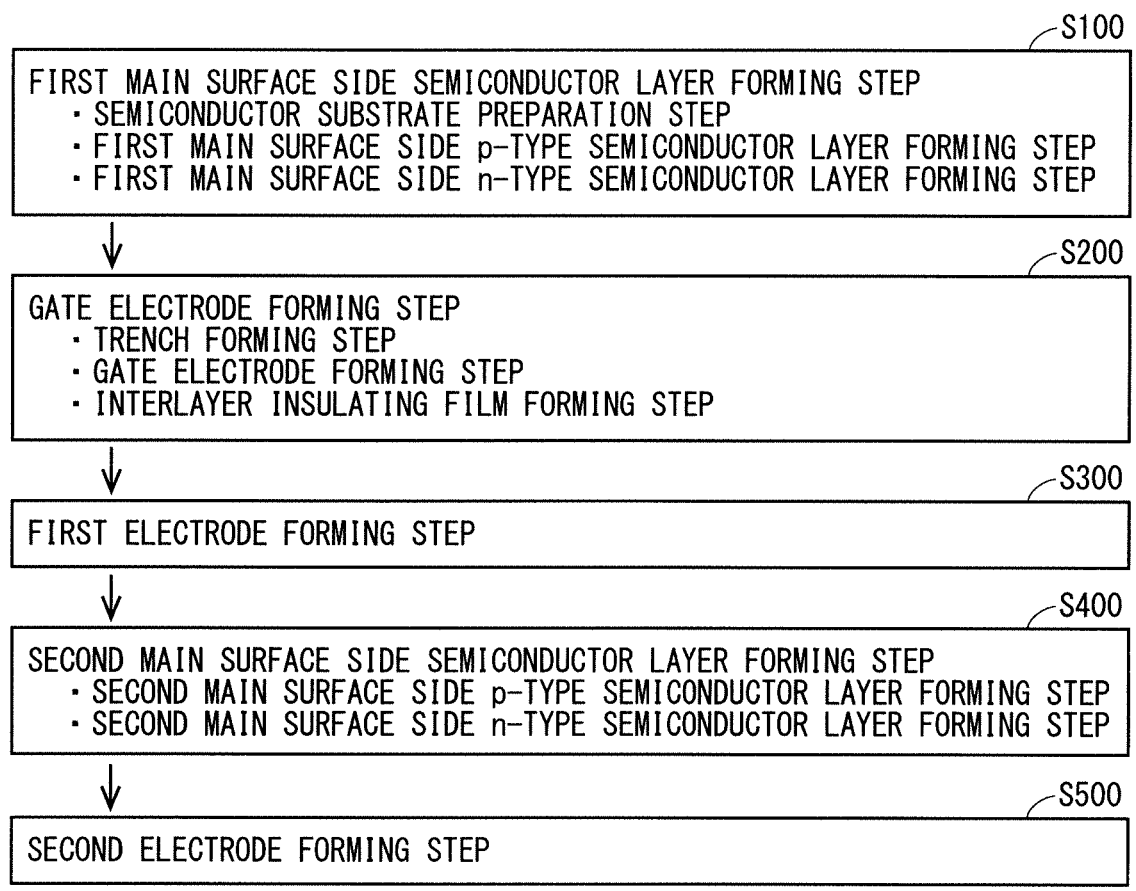
FIG. 7 is a manufacturing flowchart of the semiconductor device according to the first preferred embodiment.

Next, a method for manufacturing the semiconductor device 100 according to the first preferred embodiment will be described. FIG. 7 is a manufacturing flowchart of the semiconductor device according to the first preferred embodiment. The manufacturing method will be described according to the order of the manufacturing flowchart. In the following description of the manufacturing method, the manufacturing method for the active region is described, and the manufacturing methods for the termination region 9, the gate signal receiving region 8, and the like are omitted.

As shown in FIG. 7, the semiconductor device according to the first preferred embodiment is manufactured going through a first main surface side semiconductor layer forming step (S100), a gate electrode forming step (S200), a first electrode forming step (S300), a second main surface side semiconductor layer forming step (S400), and a second electrode forming step (S500). The first main surface side semiconductor layer forming step (S100) is divided into a semiconductor substrate preparation step, a first main surface side p-type semiconductor layer forming step, and a first main surface side n-type semiconductor layer forming step. The gate electrode forming step (S200) is divided into a trench forming step, a gate electrode forming step, and an interlayer insulating film forming step. The second main surface side semiconductor layer forming step (S400) is divided into a second main surface side p-type semiconductor layer forming step and a second main surface side n-type semiconductor layer forming step.

FIGS. 8A to 11B are diagrams each showing a manufacturing process of the semiconductor device according to the first preferred embodiment. FIG. 8B is a diagram showing a manufacturing process in a cross section taken along C-C line shown in FIG. 2, and the drawings in FIGS. 8A to 11B excluding FIG. 8B are diagrams showing a manufacturing process in a cross section taken along B-B line shown in FIG. 2.

FIGS. 8A to 8C are diagrams showing a manufacturing process of the first main surface side semiconductor layer forming step. FIG. 8A is a diagram showing a state in which the semiconductor substrate preparation step is completed. The semiconductor substrate preparation step is a step of preparing an n-type semiconductor substrate having a low donor concentration. Since the concentration of the donor of the drift layer 1 is the concentration of the donor of the semiconductor substrate itself, the semiconductor substrate is prepared according to the concentration of the donor of the drift layer 1. When the semiconductor substrate preparation step is completed, the insulated gate bipolar transistor region 10, the diode region 20, and the boundary region 70 include only the drift layer 1.

FIG. 8B is a diagram showing the manufacturing process of the first main surface side p-type semiconductor layer forming step. The first main surface side p-type semiconductor layer forming step is a step of forming the base layer 11, the base contact layer 13, the anode layer 21, the anode contact layer 23, the boundary portion semiconductor layer 71, and the boundary portion contact layer 73. Each semiconductor layer is formed by injecting an acceptor from the first main surface S1 side. The base layer 11 is formed by injecting an acceptor A1 into the insulated gate bipolar transistor region 10, the anode layer 21 is formed by injecting an acceptor A2 into the diode region from the first main surface S1 side, and the boundary portion semiconductor layer 71 is formed by injecting an acceptor A3 into the boundary region 70 from the first main surface S1 side. As the acceptors A1, A2, and A3, for example, boron or aluminum is used. Acceptors A1, A2, and A3 can be the same acceptor. When acceptors A1, A2, and A3 are the same acceptor, the work of switching acceptors is unnecessary.

It is possible to inject acceptors A1, A2, and A3 at the same time when acceptors A1, A2, and A3 are used as the same acceptor and the injection volume is the same. The injected acceptors A1, A2, and A3 are diffused by heating to form a base layer 11, an anode layer 21, and a boundary portion semiconductor layer 71. The acceptors A1, A2, and A3 may be heated at the same time.

The base contact layer 13 is formed by injecting an acceptor A4 into the insulated gate bipolar transistor region 10 from the first main surface S1 side, the anode contact layer 23 is formed by injecting an acceptor A5 into the diode region 20 from the first main surface S1 side, and the boundary portion contact layer 73 is formed by injecting an acceptor A6 into the boundary region 70 from the first main surface S1 side. The acceptor A4 is injected shallower than the acceptor A1, the acceptor A5 is injected shallower than the acceptor A2, and the acceptor A6 is injected shallower than the acceptor A3. As the acceptors A4, A5, and A6, for example, boron or aluminum is used. The acceptors A4, A5, and A6 may be the same acceptor, and may have the same injection volume.

It is possible to inject acceptors A4, A5, and A6 at the same time when acceptors A4, A5, and A6 are used as the same acceptor and the injection volume is the same. The injected acceptors A4, A5, and A6 are diffused by heating to form a base contact layer 13, an anode contact layer 23, and a boundary portion contact layer 73. The acceptors A4, A5, and A6 may be heated at the same time.

When using different acceptors or when using different injection volumes, as acceptors A1, A2, and A3, each acceptor has only to be selectively injected into the semiconductor substrate using a first main surface side acceptor injection mask (not shown). The first main surface side acceptor injection mask may be, for example, a resist mask formed by applying a resist onto the first main surface S1 to prevent permeation of the acceptor, and providing the first main surface side acceptor injection mask at a place where the acceptor is not injected, injecting the acceptor, and then removing the first main surface side acceptor injection mask has only to be performed. Similarly, even when different acceptors are used or even when different injection volumes are used, as acceptors A4, A5, and A6, the first main surface side acceptor injection mask has only to be used.

FIG. 8C is a diagram showing a manufacturing process of the first main surface side n-type semiconductor layer forming step. The first main surface side n-type semiconductor layer forming step is a step of forming the emitter layer 12 and the carrier injection suppression layer 72. The emitter layer 12 is formed by injecting a donor D1 into the insulated gate bipolar transistor region 10, and the carrier injection suppression layer 72 is formed by injecting a donor D2 into the boundary region 70 from the first main surface S1 side. As the donors D1 and D2, arsenic, phosphorus, or the like is used. The donor D1 and the donor D2 may be the same donor, and may be the same injection volume.

The emitter layer 12 is formed by selectively injecting a donor D1 into the surface layer of the base layer 11, and the carrier injection suppression layer 72 is formed by selectively injecting a donor D2 into the surface layer of the boundary portion semiconductor layer 71. In order to selectively form the emitter layer 12 and the carrier injection suppression layer 72, the donor D1 and the donor D2 have only to be selectively injected using a first main surface side donor injection mask (not shown). The first main surface side donor injection mask may be, for example, a resist mask formed by applying a resist onto the first main surface S1 to prevent permeation of the donor, and providing the first main surface side donor injection mask at a place where the donor is not injected, injecting the donor, and then removing the first main surface side donor injection mask has only to be performed. The injected donor is diffused by heating to form an emitter layer 12 and a carrier injection suppression layer 72.

Figure 9A:
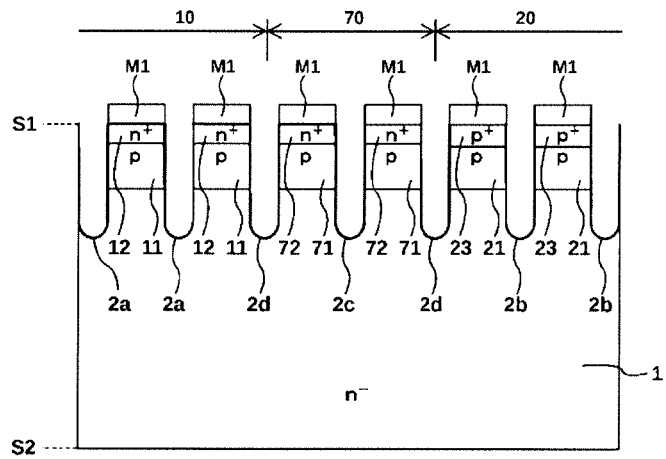
Figure 9B:
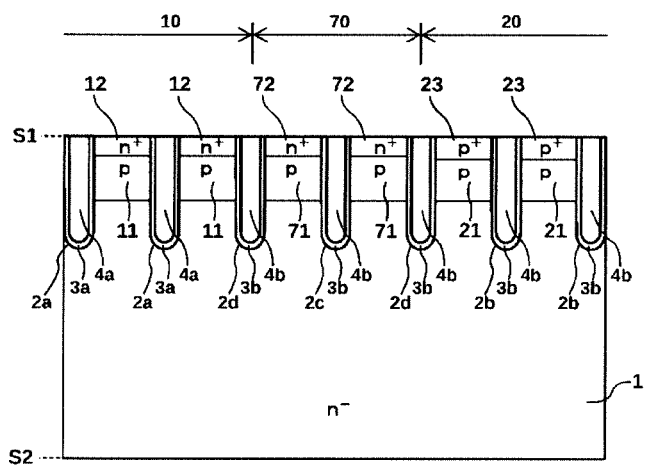
Figure 9C:
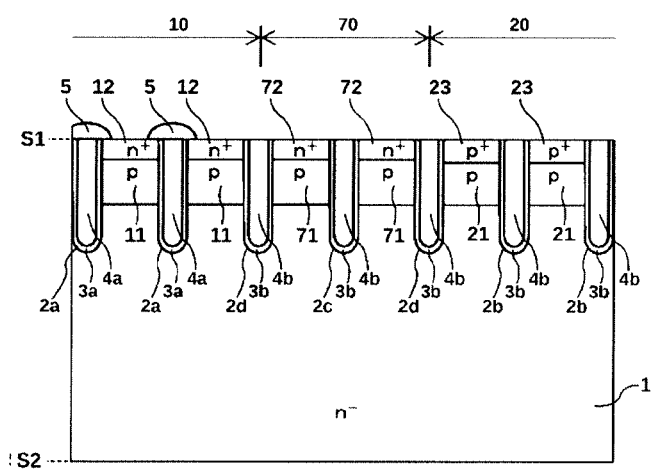

FIGS. 9A to 9C are diagrams showing a manufacturing process of the gate electrode forming step.

FIG. 9A is a diagram showing a manufacturing process of the trench forming step. The trench forming step is a step of forming trenches 2a, 2b, 2c, and 2d on the first main surface S1 side by etching. A trench mask M1 is formed in advance before etching at places where trenches 2a, 2b, 2c, and 2d are not formed. The trench mask M1 is, for example, a mask made of an oxide film formed by heating on the first main surface S1, and is removed after the trench is formed.

FIG. 9B is a diagram showing a manufacturing process of the gate electrode forming step. The gate electrode forming step is a step of depositing the gate electrode 4a in the trench 2a to form the gate electrode 4b in the trenches 2b, 2c, and 2d. First, an oxide film is formed on the side walls of the trenches 2a, 2b, 2c, and 2d by heating. After the oxide film is formed, the gate electrodes 4a and 4b are deposited from the first main surface S1 side. The gate electrodes 4a and 4b are formed by depositing the same conductive material. The gate electrodes 4a and 4b are formed by depositing, for example, polysilicon. After the polysilicon is deposited on the entire surface on the first main surface S1, unnecessary polysilicon is removed by etching. The polysilicon left inside the trench 2a becomes the gate electrode 4a, and the polysilicon left inside the trenches 2b, 2c, and 2d becomes the gate electrode 4b. In addition, an unnecessary oxide film is removed, the oxide film left inside the trench 2a becomes the gate insulating film 3a, and the oxide film left inside the trenches 2b, 2c, and 2d becomes the gate insulating film 3b.

FIG. 9C is a diagram showing a state in which the interlayer insulating film forming step is completed. The interlayer insulating film forming step is a step of forming an interlayer insulating film 5 which is an insulator on the gate electrode 4a. The interlayer insulating film 5 is, for example, an oxide film formed by Chemical Vapor Deposition (CVD). The oxide film formed on the first main surface S1 other than the gate electrode 4a is removed by, for example, etching.

FIG. 10 is a diagram showing a state in which the first electrode forming step is completed. The first electrode forming step is a step of forming the first electrode 6. The first electrode 6 is formed by, for example, sputtering a metal from the first main surface S1 side. For example, aluminum is used as the metal. Sputtering forms the interlayer insulating film 5, and the first electrode 6 covering the first main surface S1.

FIGS. 11A and 11B are diagrams showing a manufacturing process of the second main surface side semiconductor layer forming step.

FIG. 11A is a diagram showing a manufacturing process of the second main surface side p-type semiconductor layer forming step. The second main surface side p-type semiconductor layer forming step is a step of forming a collector layer 14. The collector layer 14 is formed by injecting an acceptor A7 from the second main surface S2 side. A second main surface side acceptor injection mask M2 may be used on the second main surface S2 of the diode region 20 where the acceptor A7 is not injected. The second main surface side acceptor injection mask M2 is formed by applying a resist onto the second main surface S2, for example, and is removed after the acceptor A7 is injected. The injected acceptor A7 is diffused by heating to form a collector layer 14.

FIG. 11B is a diagram showing a manufacturing process of the second main surface side n-type semiconductor layer forming step. The second main surface side n-type semiconductor layer forming step is a step of forming a cathode layer 25. The cathode layer 25 is formed by injecting a donor D3 from the second main surface S2 side. As the donor D3, arsenic, phosphorus, or the like is used. A second main surface side donor injection mask M3 may be used on the second main surface S2 of the insulated gate bipolar transistor region 10 and the boundary region 70 where the donor D3 is not injected. The second main surface side donor injection mask M3 is formed by applying a resist onto the second main surface S2, for example, and is removed after the donor D3 is injected. The injected donor D3 is diffused by heating to form a cathode layer 25. The cathode layer 25 is formed after the collector layer 14 is formed, but the order of formation is not limited to this. For example, the collector layer 14 may be formed after the cathode layer 25 is formed. In addition, the acceptor A7 and the donor D3 may be heated and diffused at the same time.

The second electrode forming step (not shown) is a step of forming the second electrode 7. The second electrode 7 is formed by, for example, sputtering a metal from the second main surface S2 side. For example, aluminum is used as the metal. Sputtering forms the second electrode 7 that covers the second main surface S2. Through the above steps, the semiconductor device 100 shown in FIG. 1 is obtained.

The reflux operation of the semiconductor device according to the first preferred embodiment will be described. FIG. 12 is a diagram schematically showing movement of holes during reflux operation of the semiconductor device according to the first preferred embodiment. FIG. 12 is a diagram schematically showing the movement of the holes during the reflux operation in the cross-sectional view taken along line F-F in FIG. 2. During the reflux operation, a positive voltage with respect to the second electrode 7 is applied to the first electrode 6. Applying a positive voltage injects holes h into the drift layer 1 from the base layer 11, the base contact layer 13, the anode layer 21, the anode contact layer 23, the boundary portion semiconductor layer 71, and the boundary portion contact layer 73, which are p-type semiconductor layers, and the holes h injected into the drift layer 1 move toward the cathode layer 25. The diode region 20 near the boundary with the boundary region 70 is in a state of having a high density of holes h as compared with the diode region 20 away from the boundary region 70 because the holes h flow in also from the insulated gate bipolar transistor region 10 and the boundary region 70. During the reflux operation, a reflux current flows in the direction from the first electrode 6 to the second electrode 7.

The recovery operation of the semiconductor device according to the first preferred embodiment will be described. FIG. 13 is a diagram schematically showing movement of holes during the recovery operation of the semiconductor device according to the first preferred embodiment. FIG. 13 is a diagram schematically showing the movement of the holes during recovery operation in the cross-sectional view taken along line F-F in FIG. 2. During the recovery operation, a negative voltage with respect to the second electrode 7 is applied to the first electrode 6. The holes h having moved toward the cathode layer 25 during the reflux operation move to change the moving direction toward the anode layer 21. During the recovery operation, the holes h flow out to the outside of the semiconductor device via the anode layer 21, the anode contact layer 23, and the first electrode 6. As compared with through the anode layer 21 and anode contact layer 23 in the diode region 20 away from the boundary region 70, more holes h pass through the anode layer 21 and the anode contact layer 23 of the diode region 20 near the boundary with the boundary region 70 where the density of the hole has been high during the reflux operation. In addition, some of the holes h existing in the insulated gate bipolar transistor region 10 flow out to the outside of the semiconductor device via the base layer 11, the base contact layer 13, and the first electrode 6, and some of the holes h existing in the boundary region 70 flow out to the outside of the semiconductor device via the boundary portion semiconductor layer 71, the boundary portion contact layer 73, and the first electrode 6. During the recovery operation, a recovery current flows in the direction from the second electrode 7 toward the first electrode 6.

The effect of hole injection suppression of the semiconductor device according to the first preferred embodiment will be described with reference to FIG. 12.

The semiconductor device according to the first preferred embodiment suppresses the holes h flowing into the diode region 20 from the insulated gate bipolar transistor region 10 and the boundary region 70. First, the suppression of the holes h flowing into the diode region 20 from the insulated gate bipolar transistor region 10 will be described. The total amount of holes h flowing from each p-type semiconductor layer into the cathode layer 25 during the reflux operation is determined by the magnitude of the reflux current. The ratio of holes flowing from each p-type semiconductor layer into the cathode layer 25 is affected by the acceptor concentration of each p-type semiconductor layer and the distance to the cathode layer 25. The higher the acceptor concentration of each p-type semiconductor layer and the shorter the distance to the cathode layer 25, the more holes the p-type semiconductor layer causes to flow toward the cathode layer 25.

In the semiconductor device according to the first preferred embodiment, the collector layer 14 protrudes from the insulated gate bipolar transistor region 10 to the boundary region 70. Therefore, the base layer 11 and the base contact layer 13 can be arranged apart from the cathode layer 25, and the holes h flowing into the diode region 20 from the insulated gate bipolar transistor region 10 can be suppressed.

Subsequently, suppression of the holes h flowing from the boundary region 70 into the diode region 20 will be described. An n-type carrier injection suppression layer 72 is provided in the surface layer of the boundary portion semiconductor layer 71 of the boundary region 70. Since the carrier injection suppression layer 72 is the n-type, it does not inject holes h toward the cathode layer 25 during the reflux operation. Therefore, the holes h flowing from the boundary region 70 into the diode region 20 can be suppressed. In addition, it is desirable that the carrier injection suppression layer 72 and the boundary portion contact layer 73 are arranged in combination in the surface layer of the semiconductor substrate in the boundary region 70. This is because arranging the carrier injection suppression layer 72 in combination with the boundary portion contact layer 73 having a high acceptor concentration allows the contact resistance between the first electrode 6 and the boundary portion contact layer 73 to be reduced, so that heat generation in the boundary region can be suppressed, in addition to the destruction suppression effect by latch-up.

The diode region 20 of the semiconductor device according to the first preferred embodiment has a structure in which there is no n-type semiconductor layer between the end portion on the second main surface S2 side of the anode layer 21, that is, the boundary between the anode layer 21 and the drift layer 1, and the first main surface S1. When an n-type semiconductor layer is provided between the end portion on the second main surface S2 side of the anode layer 21 and the first main surface S1, it is possible to suppress the holes h injected from the first main surface side of the diode region 20 during the reflux operation. However, this is because as the holes h injected from the diode region 20 is suppressed, the injection of the holes h from the insulated gate bipolar transistor region 10 and the boundary region 70 increases, and as a result, the density of the holes of the diode region 20 near the boundary with the boundary region 70 is increased. Adopting a structure in which there is no n-type semiconductor layer between the end portion on the second main surface S2 side of the anode layer 21 and the first main surface S1 allows the injection of the holes h from the insulated gate bipolar transistor region 10 and the boundary region 70 into the diode region 2 to be suppressed and the breakdown tolerance during the recovery operation to be improved.

From the above, in the semiconductor device according to the first preferred embodiment, providing a collector layer 14 protruding from the insulated gate bipolar transistor region 10 on the second main surface side of the boundary region 70 and further selectively providing a carrier injection suppression layer 72 in the surface layer of the boundary portion semiconductor layer 71 allows holes flowing into the diode region 20 from the insulated gate bipolar transistor region 10 and the boundary region 70 to be suppressed, and the breakdown tolerance during the recovery operation to be improved.

It should be noted that in the first preferred embodiment, a structure in which gate electrodes 4a are arranged in all trenches 2a of the insulated gate bipolar transistor region 10, in other words, a structure referred to as what is called a full gate structure, in which only the active gate electrode is included in the insulated gate bipolar transistor region 10, is shown, but there is no need to arrange the gate electrodes 4a in all the trenches of the insulated gate bipolar transistor region 10, and a structure in which gate electrodes 4b being dummy gate electrodes electrically connected to the first electrode 18 are arranged in some trenches among the plurality of trenches arranged in the insulated gate bipolar transistor region 10, in other words, a structure referred to as what is called a thinning gate structure may be used. Adopting the thinning gate structure makes it possible to reduce the heating value when the heating value per unit area of the insulated gate bipolar transistor region 10 when energized is large.

In addition, the structure in which the gate electrode 4b is arranged in the trench 2d positioned at the boundary between the insulated gate bipolar transistor region 10 and the boundary region 70 is shown, but a structure in which the gate electrode 4a being an active gate electrode is provided in the trench 2d positioned at the boundary between the insulated gate bipolar transistor region 10 and the boundary region 70 may be used.

Second Preferred Embodiment

Figure 14:
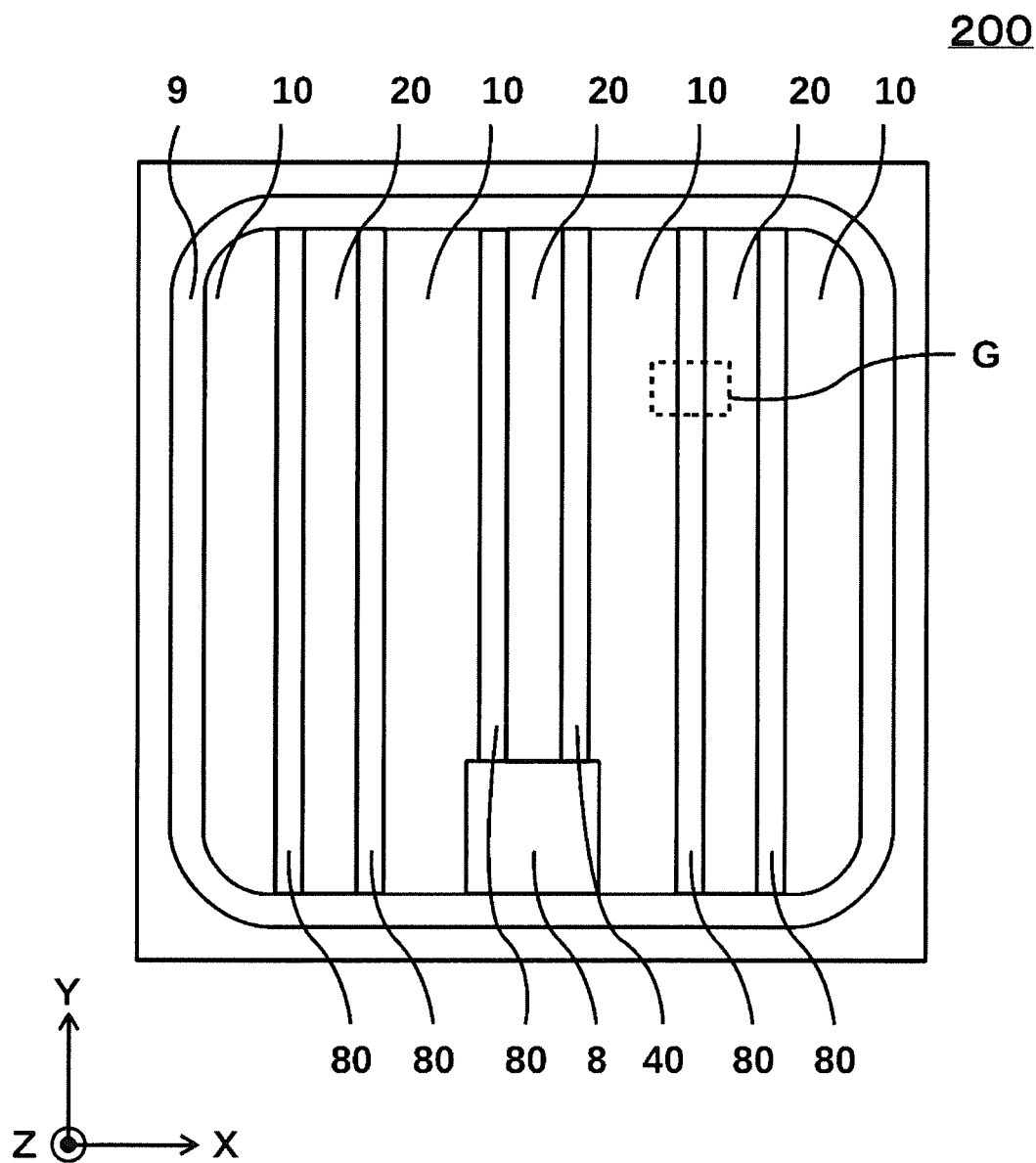

The configuration of the semiconductor device according to the second preferred embodiment will be described with reference to FIGS. 14 and 15. FIGS. 14 and 15 are plan views each showing a semiconductor device according to the second preferred embodiment. FIG. 15 is an enlarged view of a G part shown in FIG. 14, and is a plan view showing the structure on the first main surface side of the semiconductor substrate. In FIG. 15, the illustration of the electrode and the like provided above the first main surface of the semiconductor substrate is omitted. For convenience of illustration, FIGS. 14 and 15 also show XYZ orthogonal coordinate axes indicating directions. It should be noted that in the second preferred embodiment, the same components as those described in the first preferred embodiment are denoted by the same reference numerals, and its description will be omitted.

As shown in FIG. 14, a semiconductor device 200 according to the second preferred embodiment is provided with an insulated gate bipolar transistor region 10, a diode region 20, and a boundary region 80 arranged between the insulated gate bipolar transistor region 10 and the diode region 20.

As shown in FIG. 15, in the semiconductor device according to the second preferred embodiment, the carrier injection suppression layer 82 is arranged adjacent to the base contact layer 13 via the gate electrode 4b in the X direction, that is, in the direction in which a plurality of gate electrodes 4a and 4d are arranged side by side. In addition, in the X direction, the emitter layer 12 is arranged adjacent to the boundary portion contact layer 83 via the gate electrode 4b. With this arrangement, since the range in which the p-type semiconductor layers are arranged to overlap in the X direction can be reduced, it is possible to suppress the local concentration of holes injected into the diode region 20 during the reflux operation as compared with the semiconductor device according to the first preferred embodiment. Near the boundary with the boundary region 80, since balancing the hole densities in the diode region 20 balances the hole densities even during the recovery operation, the breakdown tolerance can be improved.

Third Preferred Embodiment

Figure 16:
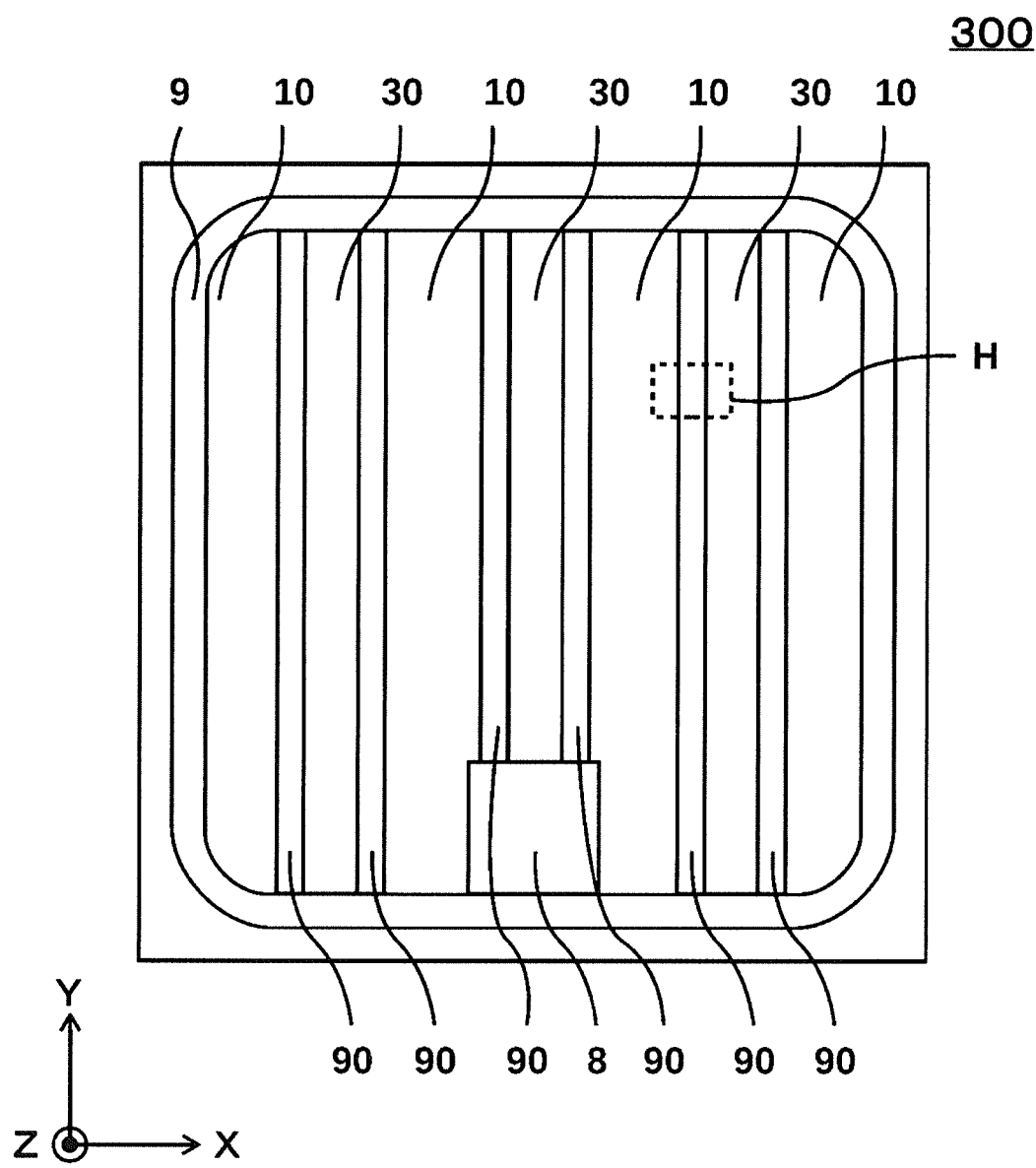
FIGS. 16 and 17 are plan views each showing a semiconductor device according to a third preferred embodiment.
Figure 17:
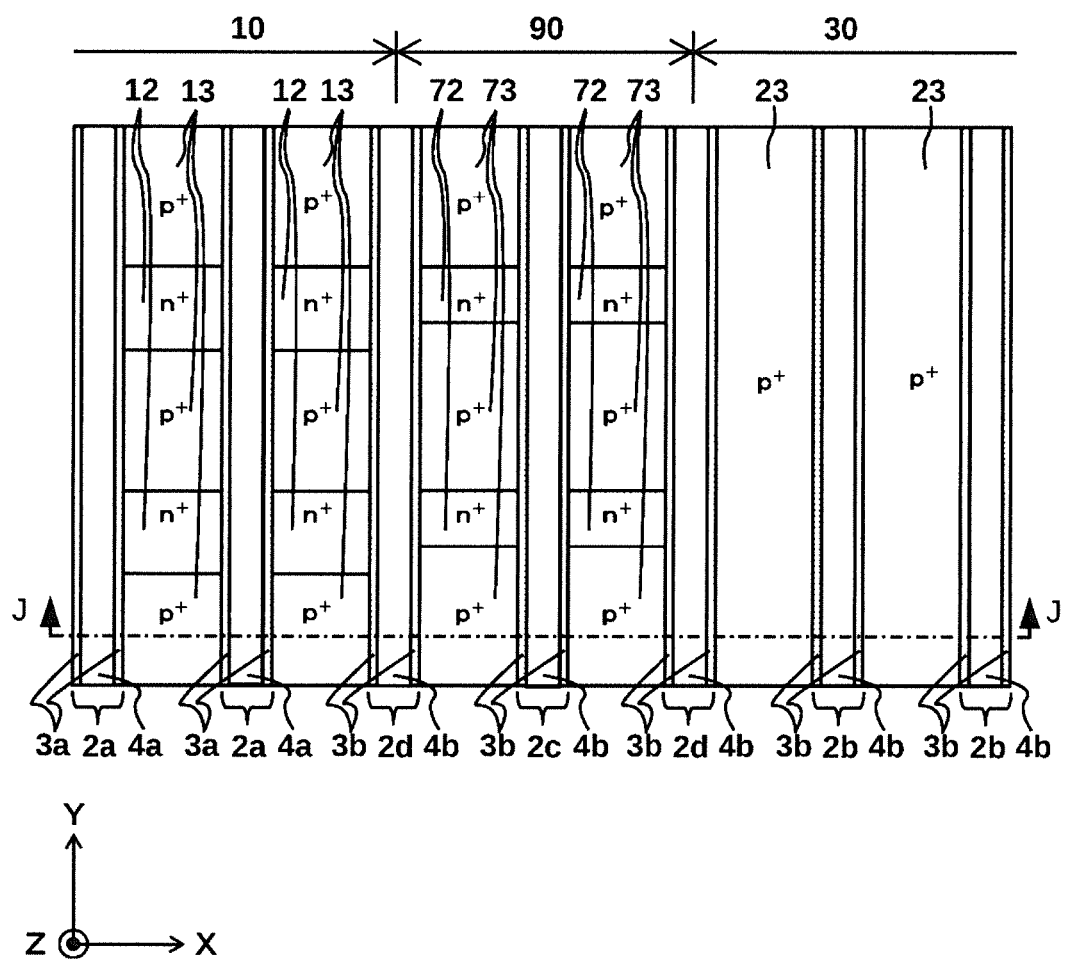

The configuration of the semiconductor device according to a third preferred embodiment will be described with reference to FIGS. 16 to 18. FIGS. 16 and 17 are plan views each showing a semiconductor device according to the third preferred embodiment. FIG. 17 is an enlarged view of an H part shown in FIG. 16, and is a plan view showing the structure on the first main surface side of the semiconductor substrate. In FIG. 17, the illustration of the electrode and the like provided above the first main surface of the semiconductor substrate is omitted. FIG. 18 is a cross-sectional view taken along line J-J shown in FIG. 17. For convenience of illustration, FIGS. 16 to 18 also show XYZ orthogonal coordinate axes indicating directions. It should be noted that in the third preferred embodiment, the same components as those described in the first preferred embodiment and the second preferred embodiment are denoted by the same reference numerals, and its description will be omitted.

As shown in FIG. 16, a semiconductor device 300 according to the third preferred embodiment is provided with an insulated gate bipolar transistor region 10, a diode region 30, and a boundary region 90 arranged between the insulated gate bipolar transistor region 10 and the diode region 30.

As shown in FIG. 17, the structure on the first main surface side of the semiconductor substrate of the semiconductor device according to the third preferred embodiment is the same as the structure according to the first preferred embodiment.

As shown in FIG. 18, in the semiconductor device according to the third preferred embodiment, the concentration of the acceptor in the boundary portion semiconductor layer 91 is lower than the concentration of the acceptor in the base layer 11. As described above, the closer to the cathode layer 25 the p-type semiconductor layer is, the more the holes injected from each p-type semiconductor layer on the first main surface S1 side toward the cathode layer 25. Therefore, making the concentration of the acceptor in the boundary portion semiconductor layer 91 near the cathode layer 25 lower than the concentration of the acceptor in the base layer 11 away from the cathode layer 25 makes it possible to suppress holes flowing into the diode region 30 during the reflux operation.

In addition, in the semiconductor device according to the third preferred embodiment, the concentration of the acceptor in the anode layer 31 is lower than the concentration of the acceptor in the base layer 11. The effect of making the concentration of the acceptor in the anode layer 31 lower than the concentration of the acceptor in the base layer 11 will be described.

During the recovery operation period, the holes stored inside the semiconductor device during the reflux operation flow out to the outside of the semiconductor device due to the recovery current. The outflow of holes to the outside depletes the inside of the semiconductor device. Depletion proceeds especially from near the interface between the drift layer 1 and the anode layer 31. The recovery current continues to increase until the vicinity of the interface between the drift layer 1 and the anode layer 31 becomes depleted, and when the vicinity of the interface between the drift layer 1 and the anode layer 31 becomes depleted, the recovery current decreases and the recovery operation ends.

When the concentration of the acceptor in the anode layer 31 is lower than the concentration of the acceptor in the base layer 11, the hole density near the interface between the drift layer 1 and the anode layer 31 decreases. Therefore, the depletion near the interface between the drift layer 1 and the anode layer 31 can be accelerated, the maximum value of the recovery current can be suppressed, and the recovery operation period can be shortened. That is, making the concentration of the acceptor in the anode layer 31 lower than the concentration of the acceptor in the base layer 11 allows the breakdown tolerance during the recovery operation to be improved.

However, making the concentration of the acceptor in the anode layer 31 lower than the concentration of the acceptor in the base layer 11 increases the number of the holes that flow into the diode region 30 from each p-type semiconductor layer on the first main surface S1 side of the insulated gate bipolar transistor region 10 and the boundary region 90.

In the semiconductor device according to the third preferred embodiment, since the collector layer 14 protruding from the insulated gate bipolar transistor region 10 is provided on the second main surface side of the boundary region 90, it is possible to suppress the increase in holes flowing from the insulated gate bipolar transistor region 10 into the diode region 30. In addition, since the carrier injection suppression layer 72 is provided on the second main surface side of the boundary region 90, it is possible to suppress the increase in holes flowing from the boundary region 90 into the diode region 30.

From the above, in the semiconductor device according to the third preferred embodiment, since the holes flowing from the insulated gate bipolar transistor region 10 and the boundary region 90 into the diode region 30 can be suppressed, and the recovery current and the recovery operation period can be shortened, it is possible to improve the breakdown tolerance during the recovery operation.

Fourth Preferred Embodiment

Figure 19:
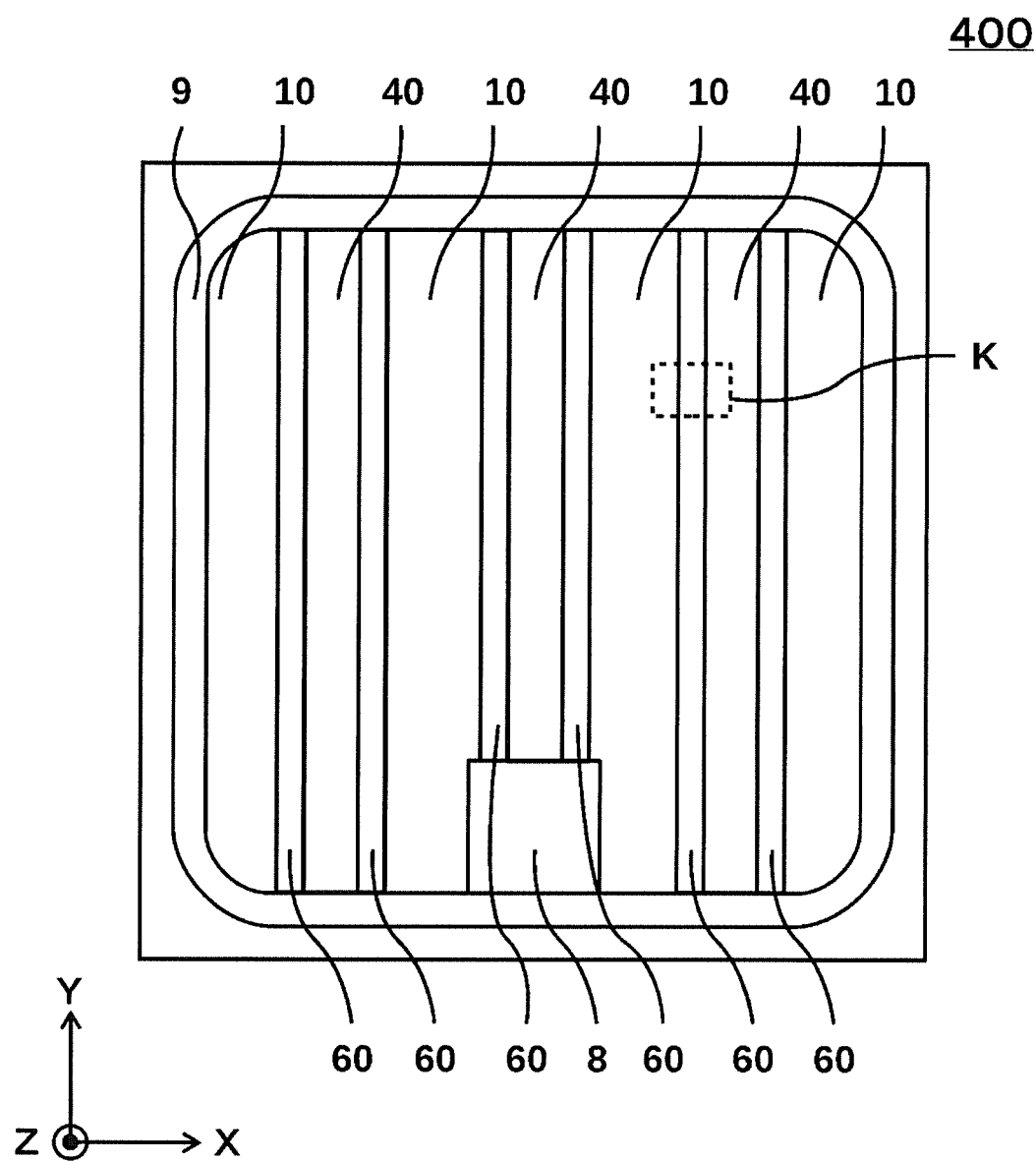
FIGS. 19 and 20 are plan views each showing a semiconductor device according to a fourth preferred embodiment.
Figure 20:
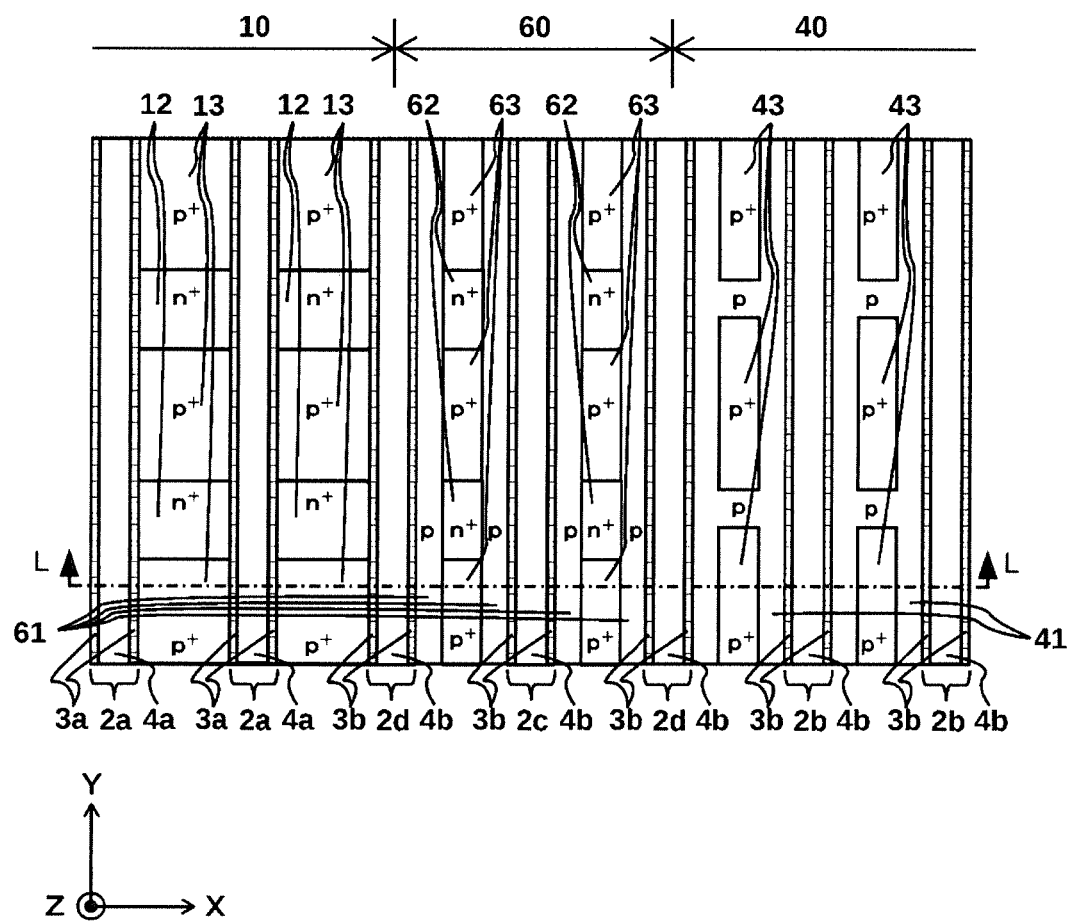
Figure 21:
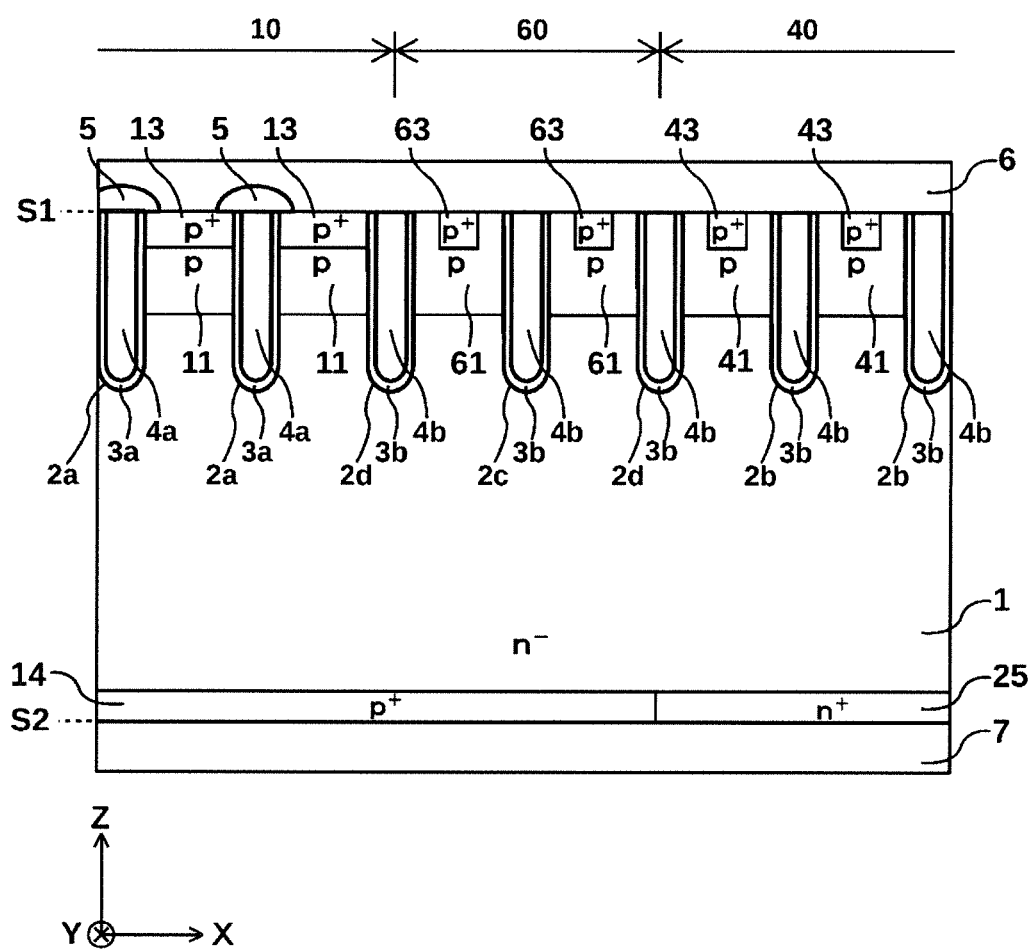
FIG. 21 is a cross-sectional view showing the semiconductor device according to the fourth preferred embodiment.

The configuration of the semiconductor device according to a fourth preferred embodiment will be described with reference to FIGS. 19 to 21. FIGS. 19 and 20 are plan views each showing a semiconductor device according to the fourth preferred embodiment. FIG. 20 is an enlarged view of a K part shown in FIG. 19, and is a plan view showing the structure on the first main surface side of the semiconductor substrate. In FIG. 20, the illustration of the electrode and the like provided above the first main surface of the semiconductor substrate is omitted. FIG. 21 is a cross-sectional view showing a semiconductor device according to the fourth preferred embodiment. FIG. 21 is a cross-sectional view taken along line L-L shown in FIG. 20. For convenience of illustration, FIGS. 19 to 21 also show XYZ orthogonal coordinate axes indicating directions. It should be noted that in the fourth preferred embodiment, the same components as those described in the first preferred embodiment to the third preferred embodiment are denoted by the same reference numerals, and its description will be omitted.

As shown in FIG. 19, a semiconductor device 400 according to the fourth preferred embodiment is provided with an insulated gate bipolar transistor region 10, a diode region 40, and a boundary region 60 arranged between the insulated gate bipolar transistor region 10 and the diode region 40.

As shown in FIG. 20, in the semiconductor device according to the fourth preferred embodiment, in the diode region 40, in the surface layer of the semiconductor substrate between the trenches 2d and 2b adjacent to each other and the surface layer of the semiconductor substrate between the trenches 2b adjacent to each other, a p-type anode layer 41 and a p-type anode contact layer 43 having a higher acceptor concentration than the anode layer 41 are provided. The anode contact layer 43 is arranged to be surrounded by the anode layer 41, and is repeatedly arranged in the Y direction. However, the arrangement of the anode contact layer 43 and the anode layer 41 is not limited to this. The anode contact layer 43 and the anode layer 41 have only to be arranged repeatedly in the Y direction, and the anode contact layer 43 does not necessarily have to be arranged to be surrounded by the anode layer 41. It should be noted that as shown in FIG. 3, a gate electrode 4b being a dummy gate electrode is provided inside the trench 2d and the trench 2b, and the gate electrode 4b is electrically connected to the first electrode 6.

In the boundary region 60, in the surface layer of the semiconductor substrate between the trenches 2c and 2d adjacent to each other, a p-type boundary portion semiconductor layer 61, a p-type boundary portion contact layer 63 having a higher acceptor concentration than the boundary portion semiconductor layer 61, and an n-type carrier injection suppression layer 62 having a higher donor concentration than the drift layer 1 are provided. The boundary portion contact layer 63 and the carrier injection suppression layer 62 are repeatedly arranged in the Y direction. In the X direction, the boundary portion contact layer 63 and the carrier injection suppression layer 62 are arranged to be sandwiched between the boundary portion semiconductor layers 61. It should be noted that as shown in FIG. 3, a gate electrode 4b being a dummy gate electrode is provided inside the trench 2c, and the gate electrode 4b is electrically connected to the first electrode 6.

In the semiconductor device according to the fourth preferred embodiment, in a plan view, the ratio of the area where the anode contact layer 43 between the gate electrodes 4b (second dummy gate electrodes) adjacent to each other is arranged is higher than the ratio of the area where the boundary portion contact layer 63 between the gate electrodes 4b (first dummy gate electrodes) adjacent to each other is arranged. In FIG. 20, the anode contact layer 43 and the boundary portion contact layer 63 have the same width in the X direction, but in the Y direction, the anode contact layer 43 is wider than the boundary portion contact layer 63 and has a larger area per unit, so that this satisfies the area ratio described above. However, the present disclosure is not limited to this, and setting the anode contact layer 43 and the boundary portion contact layer 63 to have the same area and shortening the repetition interval in the Y direction may arrange more anode contact layers 43 than boundary portion contact layers 63 to satisfy the above-described area ratio relationship, or setting the area of the anode contact layer 43 smaller than that of the boundary portion contact layer 63 and arranging more anode contact layers 43 than boundary portion contact layers 63 may satisfy the above area ratio.

As shown in FIG. 21, the boundary portion contact layer 63 is selectively provided in the surface layer of the boundary portion semiconductor layer 61. In addition, the anode contact layer 43 is selectively provided in the surface layer of the anode layer 41.

The effect of improving the breakdown tolerance during the recovery operation of the semiconductor device according to the fourth preferred embodiment will be described.

The boundary portion contact layer 63 is a semiconductor layer arranged close to the cathode layer 25 and having a higher acceptor concentration. Therefore, the boundary portion contact layer 63 is a semiconductor layer in which holes are most easily injected into the diode region 40 among the p-type semiconductor layers arranged on the first main surface S1 side during the reflux operation.

In a plan view, making the ratio of the area where the anode contact layer 43 between the gate electrodes 4b adjacent to each other is arranged higher than the ratio of the area where the boundary portion contact layer 63 between the gate electrodes 4b adjacent to each other is arranged makes it possible to increase the number of holes from the anode contact layer 43 toward the cathode layer 25 and decrease the number of holes from the boundary portion contact layer 63 toward the cathode layer 25 during the reflux operation.

From the above, in the semiconductor device according to the fourth preferred embodiment, it is possible to suppress the holes flowing into the diode region 40 and, during the recovery operation, improve the breakdown tolerance.

Fifth Preferred Embodiment

Figure 22:
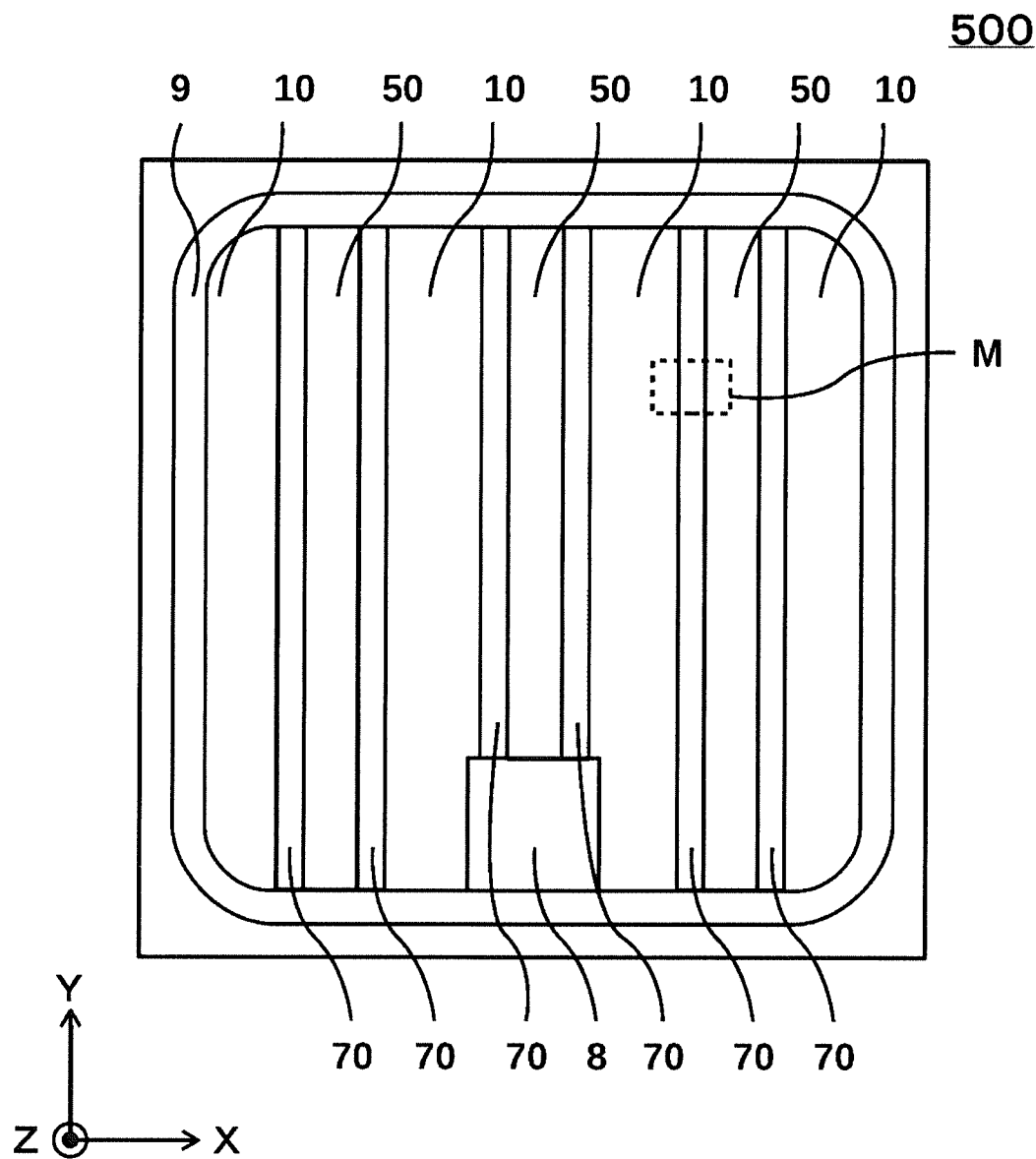
FIGS. 22 and 23 are plan views each showing a semiconductor device according to a fifth preferred embodiment.
Figure 23:
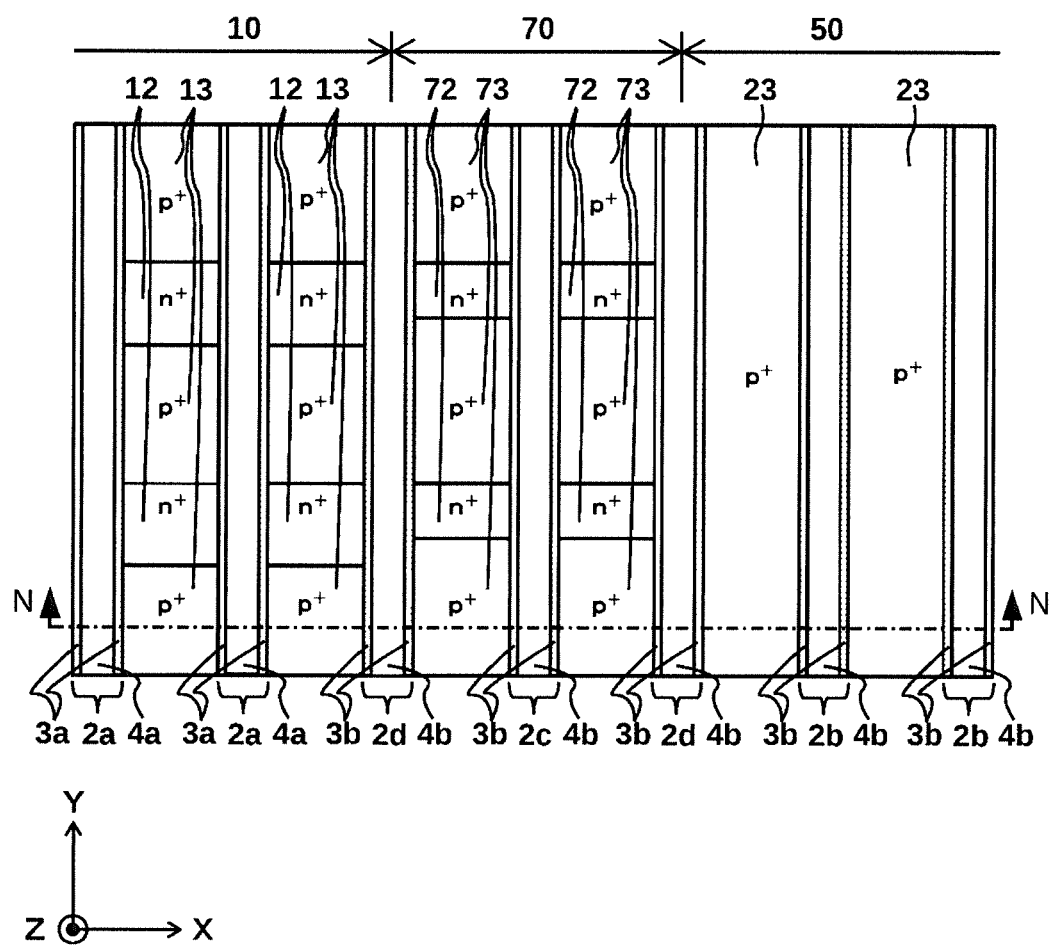
Figure 24:
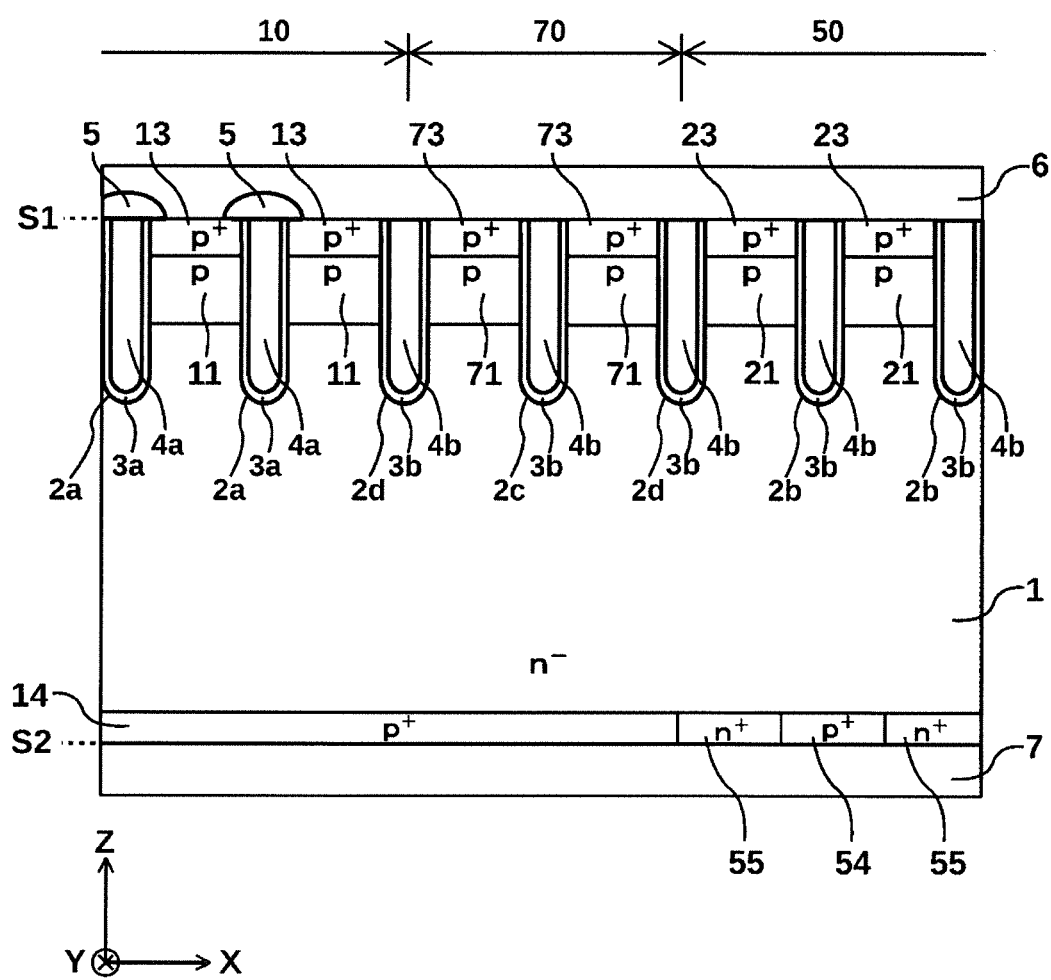
FIG. 24 is a cross-sectional view showing the semiconductor device according to the fifth preferred embodiment.

The configuration of the semiconductor device according to a fifth preferred embodiment will be described with reference to FIGS. 22 to 24. FIGS. 22 and 23 are plan views each showing a semiconductor device according to the fifth preferred embodiment. FIG. 23 is an enlarged view of an M part shown in FIG. 22, and is a plan view showing the structure on the first main surface side of the semiconductor substrate. In FIG. 23, the illustration of the electrode and the like provided above the first main surface of the semiconductor substrate is omitted. FIG. 24 is a cross-sectional view showing a semiconductor device according to the fifth preferred embodiment. FIG. 24 is a cross-sectional view taken along line N-N shown in FIG. 23. For convenience of illustration, FIGS. 22 to 24 also show XYZ orthogonal coordinate axes indicating directions. It should be noted that in the fifth preferred embodiment, the same components as those described in the first preferred embodiment to the fourth preferred embodiment are denoted by the same reference numerals, and its description will be omitted.

As shown in FIG. 22, the semiconductor device 500 according to the fifth preferred embodiment is provided with an insulated gate bipolar transistor region 10, a diode region 50, and a boundary region 70 arranged between the insulated gate bipolar transistor region 10 and the diode region 50.

As shown in FIG. 23, the structure on the first main surface side of the semiconductor substrate of the semiconductor device according to the fifth preferred embodiment is the same as the structure according to the first preferred embodiment.

As shown in FIG. 24, the semiconductor device according to the fifth preferred embodiment is provided with an n-type cathode layer 55 having a higher donor concentration than the drift layer 1 in the surface layer on the second main surface S2 side of the diode region 50, and includes a p-type cathode portion second conductivity type semiconductor layer 54 having a higher acceptor concentration than the anode layer 21 provided to be sandwiched between the cathode layers 55. The diode region 50 has a structure having an n-type cathode layer 55 and a p-type cathode portion second conductivity type semiconductor layer 54 in the surface layer on the second main surface S2 side, and has a structure referred to as what is called a Relaxed Field of Cathode (RFC) diode or the like.

The cathode portion second conductivity type semiconductor layer 54 may be formed with the same acceptor and the same injection volume as the collector layer 14. In that case, the acceptor can be injected into the cathode portion second conductivity type semiconductor layer 54 and the collector layer 14 at the same time, and the provided cathode portion second conductivity type semiconductor layer 54 has the same second conductivity type impurity concentration distribution in the depth direction from the second main surface S2 toward the first main surface S1 as the collector layer 14.

In the semiconductor device according to the fifth preferred embodiment, holes from each p-type semiconductor layer on the first main surface S1 side toward the cathode layer 55 are injected during the reflux operation. Providing a collector layer 14 protruding from the insulated gate bipolar transistor region 10 on the second main surface side of the boundary region 70 and further selectively providing a carrier injection suppression layer 72 in the surface layer of the boundary portion semiconductor layer 71 allows holes flowing into the diode region 50 from the insulated gate bipolar transistor region 10 and the boundary region 70 to be suppressed, and the breakdown tolerance during the recovery operation to be improved.

Sixth Preferred Embodiment

Figure 26:
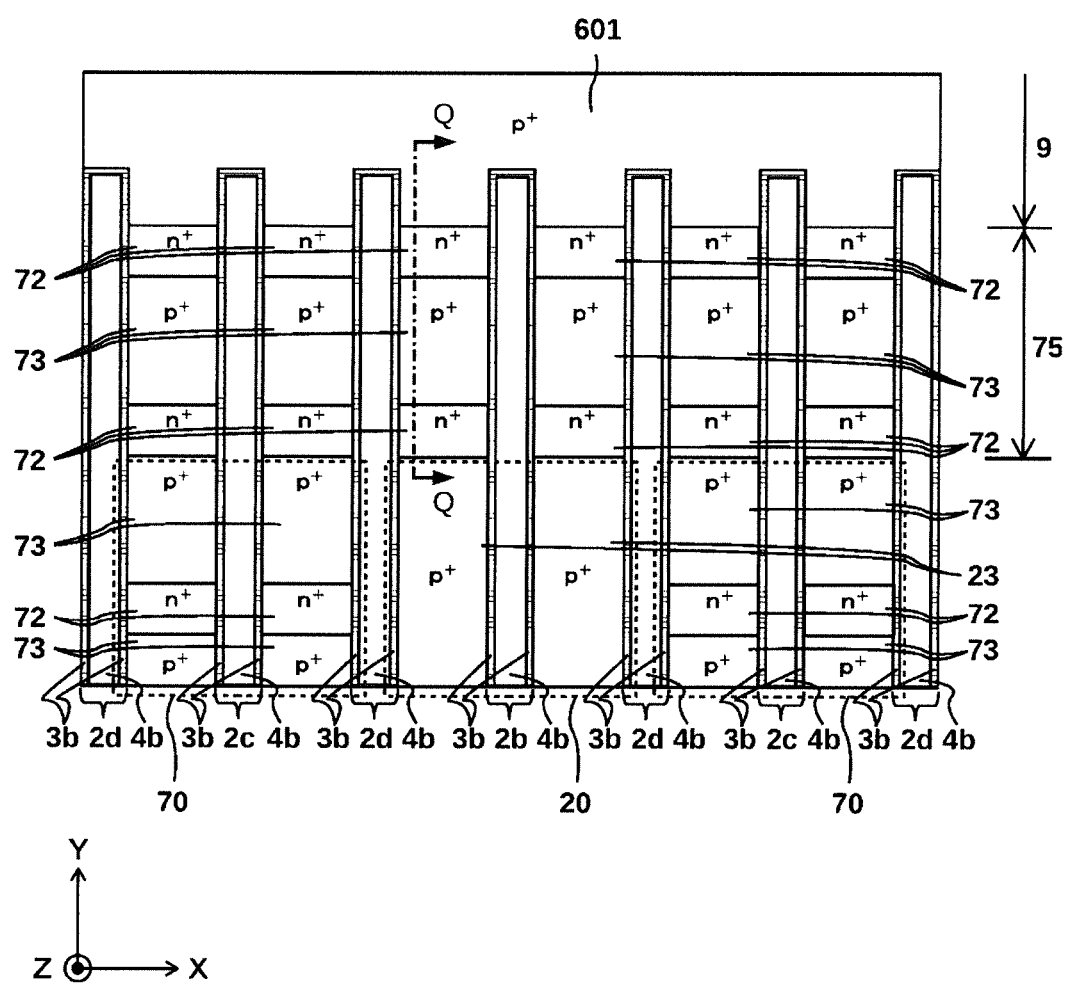

The configuration of the semiconductor device according to a sixth preferred embodiment will be described with reference to FIGS. 25 to 27. FIGS. 25 and 26 are plan views each showing a semiconductor device according to the sixth preferred embodiment. FIG. 26 is an enlarged view of a P part shown in FIG. 25, and is a plan view showing the structure on the first main surface side of the semiconductor substrate. In FIG. 26, the illustration of the electrode and the like provided above the first main surface of the semiconductor substrate is omitted. FIG. 27 is a cross-sectional view showing a semiconductor device according to the sixth preferred embodiment. FIG. 27 is a cross-sectional view taken along line Q-Q shown in FIG. 26. For convenience of illustration, FIGS. 25 to 27 also show XYZ orthogonal coordinate axes indicating directions. It should be noted that in the sixth preferred embodiment, the same components as those described in the first preferred embodiment to the fifth preferred embodiment are denoted by the same reference numerals, and its description will be omitted.

In the first to fifth preferred embodiments, the semiconductor device having the boundary region between the insulated gate bipolar transistor region and the diode region has been described, but in the sixth preferred embodiment, a semiconductor device having a second boundary region between the termination region and the diode region will be described.

As shown in FIG. 25, a semiconductor device 600 according to the sixth preferred embodiment includes a termination region 9 surrounding an insulated gate bipolar transistor region 10, a diode region 20, and a boundary region 70 in a plan view, and further includes a boundary region 75 between the termination region 9 and the diode region 20. The boundary region 75 is arranged adjacent to the diode region 20 and the boundary region 70 in the Y direction, that is, in the direction orthogonal to the direction in which a plurality of gate electrodes 4a and 4d are arranged side by side. The termination region 9 is provided adjacent to the diode region 20 and between the outer edge of the semiconductor substrate and the diode region 20.

As shown in FIG. 26, the boundary region 75 is provided over a plurality of gate electrodes 4b. In the boundary region 75, a carrier injection suppression layer 72 and a boundary portion contact layer 73 are provided in the surface layer of the semiconductor substrate between the gate electrodes 4b adjacent to each other.

A p-type termination portion well layer 601 having a higher acceptor concentration than the boundary portion semiconductor layer 71 is arranged in the surface layer of the semiconductor substrate in the termination region 9. The end portions of the trenches 2b, 2c, and 2d are covered with the termination portion well layer 601.

As shown in FIG. 27, in a depth from the first main surface S1 toward the second main surface S2, the termination portion well layer 601 is provided up to a position deeper than that of the boundary portion semiconductor layer 71. Providing the termination portion well layer 601 up to a deep position allows the concentration of the electric field generated in the termination region 9 to be suppressed. Furthermore, it is also possible to suppress the concentration of the electric field generated near the bottom portions of the end portions of the trenches 2b, 2c, and 2d shown in FIG. 26, and in that case, the termination portion well layer 601 may be provided up to a position deeper than the trenches 2b, 2c, and 2d to cover the bottom portions of the end portions of the trenches 2b, 2c, and 2d. A p-type termination portion second conductivity type semiconductor layer 602 having a higher acceptor concentration than the boundary portion semiconductor layer 71 is provided in the surface layer on the second main surface S2 side of the termination region 9. The termination portion second conductivity type semiconductor layer 602 is provided to protrude from the termination region 9 to the boundary region 75. The termination portion second conductivity type semiconductor layer 602 may be formed with the same acceptor and the same injection volume as the collector layer 14 shown in FIG. 3. In that case, the acceptor may be injected into the termination portion second conductivity type semiconductor layer 602 and the collector layer 14 at the same time, and in this case, the impurity concentration distribution of the termination portion second conductivity type semiconductor layer 602 in the depth direction from the second main surface S2 toward the first main surface S1 is the same as that of the collector layer 14.

The effect of improving the breakdown tolerance during the recovery operation of the semiconductor device according to the sixth preferred embodiment will be described.

FIG. 28 is a diagram schematically showing movement of holes during reflux operation of the semiconductor device according to the sixth preferred embodiment. FIG. 28 is a diagram schematically showing the movement of the holes during the reflux operation in the cross-sectional view taken along line Q-Q in FIG. 26. During the reflux operation, holes h are injected into the drift layer 1 from the termination portion well layer 601, the boundary portion semiconductor layer 71, the boundary portion contact layer 73, the anode layer 21, and the anode contact layer 23, which are p-type semiconductor layers, and the holes h injected into the drift layer 1 move toward the cathode layer 25. The density of holes h is higher than that of the diode region 20 away from the diode region 20 near the boundary with the boundary region 75.

Figure 29:
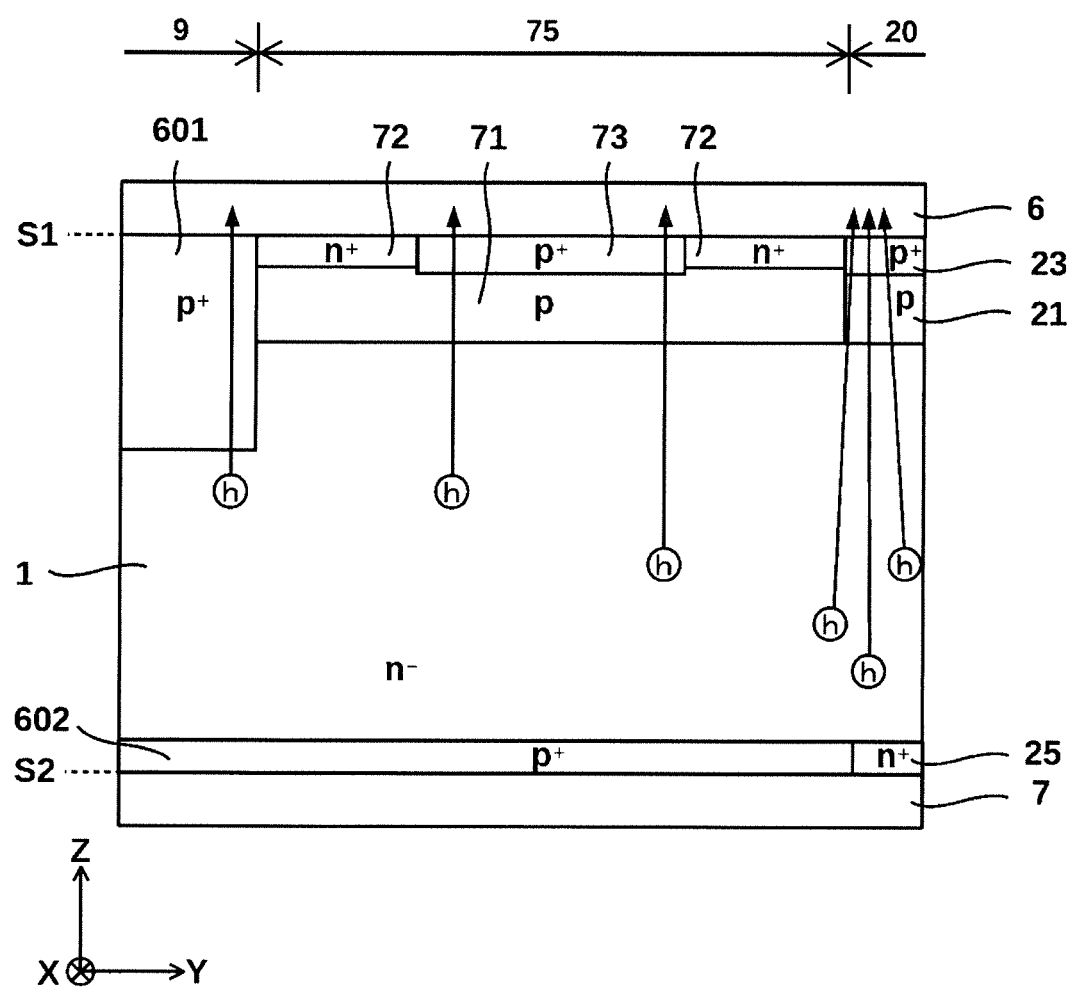
FIG. 29 is a diagram schematically showing movement of holes during recovery operation of the semiconductor device according to the sixth preferred embodiment.

Recovery operation of the semiconductor device according to the sixth preferred embodiment will be described. FIG. 29 is a diagram schematically showing movement of holes during recovery operation of the semiconductor device according to the sixth preferred embodiment. FIG. 29 is a diagram schematically showing the movement of the holes during the recovery operation in the cross-sectional view taken along line Q-Q in FIG. 26. The holes h having moved toward the cathode layer 25 during the reflux operation move to change the moving direction toward the anode layer 21. As compared with through the anode layer 21 and anode contact layer 23 in the diode region 20 away from the boundary region 75, more holes h pass through the anode layer 21 and the anode contact layer 23 of the diode region 20 near the boundary with the boundary region 75 where the density of the hole has been high during the reflux operation. In addition, some of the holes h existing in the termination region 9 flow out to the outside of the semiconductor device via the termination portion well layer 601 and the first electrode 6, and some of the holes h existing in the boundary region 75 flow out to the outside of the semiconductor device via the boundary portion semiconductor layer 71, the boundary portion contact layer 73, and the first electrode 6.

The effect of hole injection suppression of the semiconductor device according to the sixth preferred embodiment will be described with reference to FIG. 28.

In the semiconductor device according to the sixth preferred embodiment, the termination portion second conductivity type semiconductor layer 602 protrudes from the termination region 9 to the boundary region 75. Therefore, it is possible to arrange the termination portion well layer 601 away from the cathode layer 25, and it is possible to suppress the holes h flowing from the termination region 9 into the diode region 20.

In addition, an n-type carrier injection suppression layer 72 is provided in the surface layer of the boundary portion semiconductor layer 71 of the boundary region 75. Since the carrier injection suppression layer 72 is the n-type, it does not inject holes h toward the cathode layer 25 during the reflux operation. Therefore, the holes h flowing from the boundary region 75 into the diode region 20 can be suppressed.

From the above, in the semiconductor device according to the sixth preferred embodiment, the holes flowing from the termination region 9 can be suppressed, and the breakdown tolerance during the recovery operation can be improved.

In the semiconductor device according to the sixth preferred embodiment, the structure in which the boundary region 70 is provided between the diode region 20 and the insulated gate bipolar transistor region 10 is shown, but when miniaturization of semiconductor devices is prioritized, or when the ratio of holes flowing into the diode region 20 is larger from the termination region 9 than from the insulated gate bipolar transistor region 10, the structure of omitting the boundary region 70 between the diode region 20 and the insulated gate bipolar transistor region 10 may be used.

Seventh Preferred Embodiment

Figure 30:
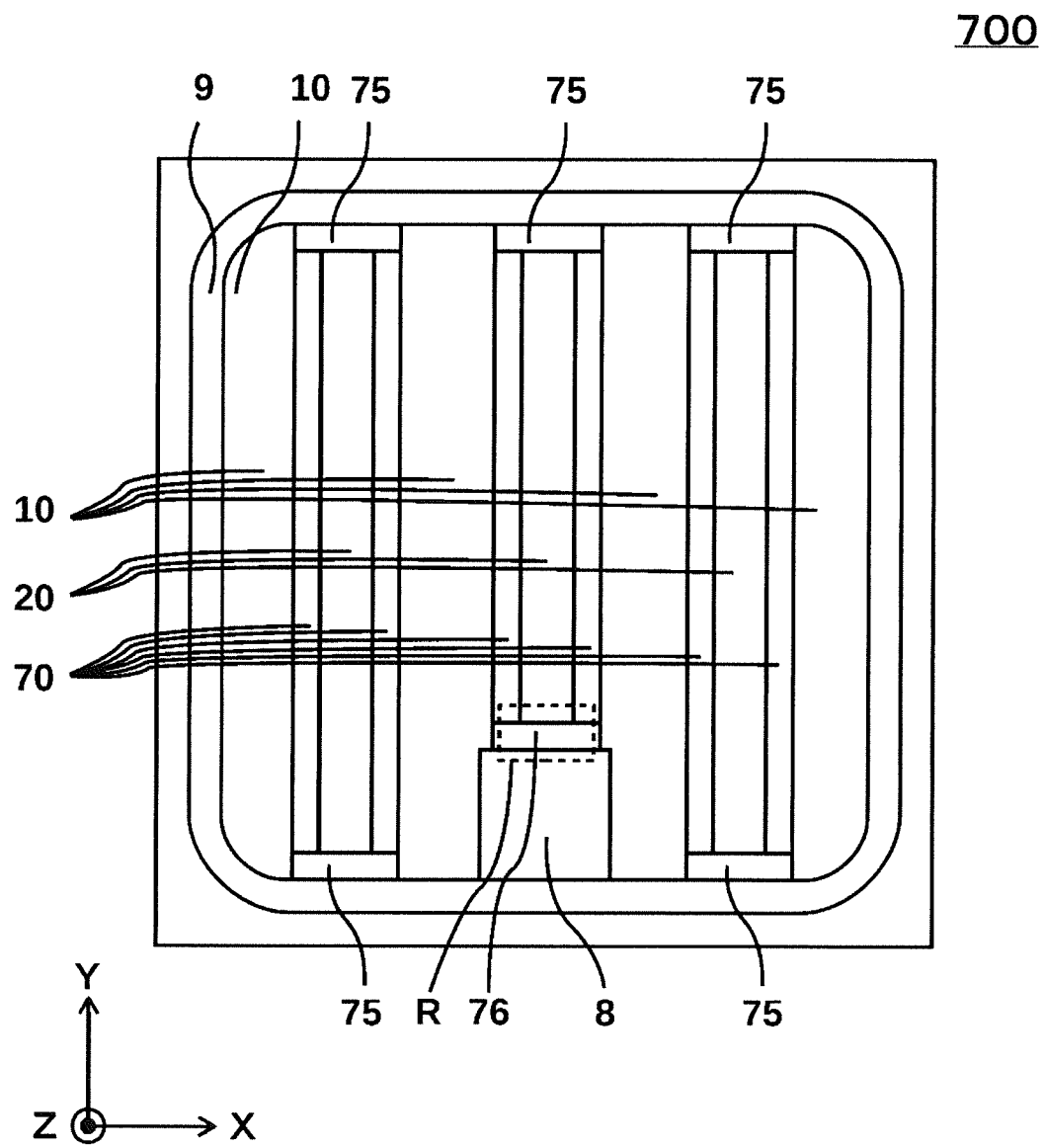
FIGS. 30 and 31 are plan views each showing a semiconductor device according to a seventh preferred embodiment.
Figure 31:
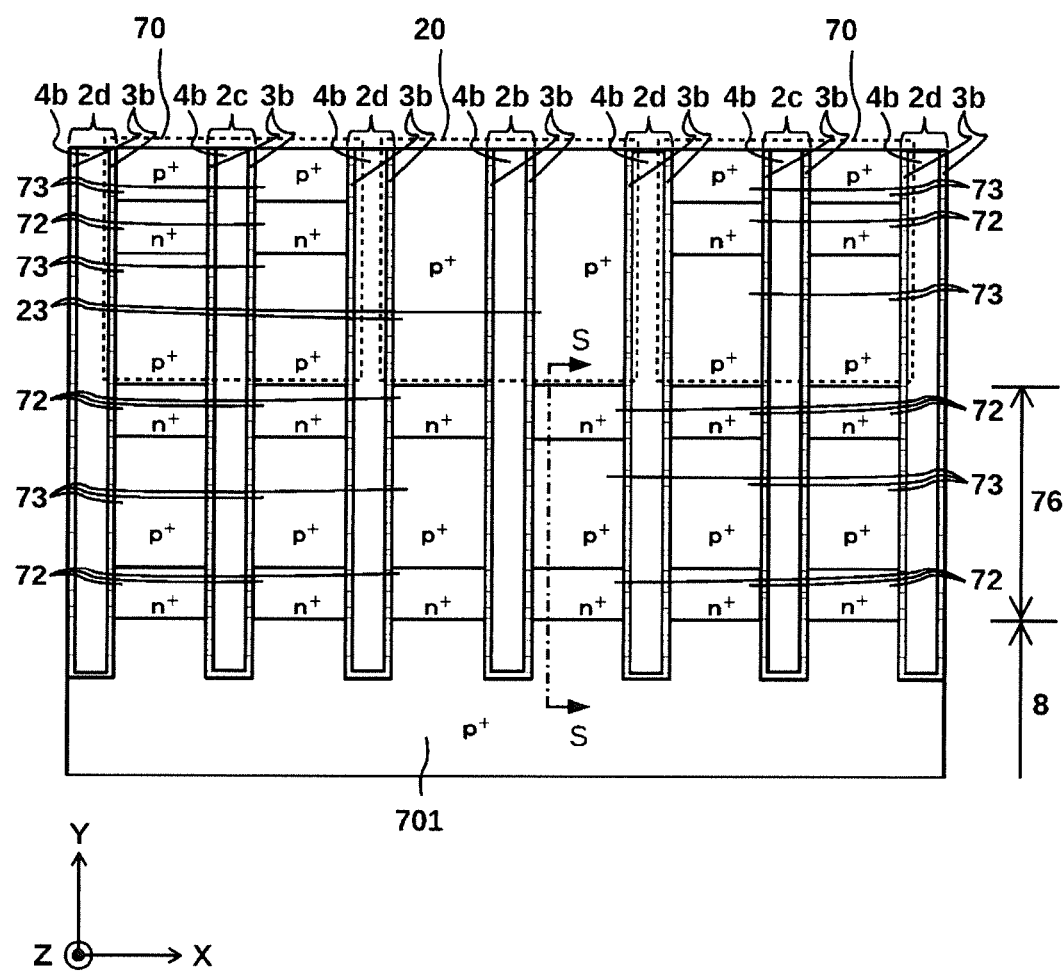
Figure 32:
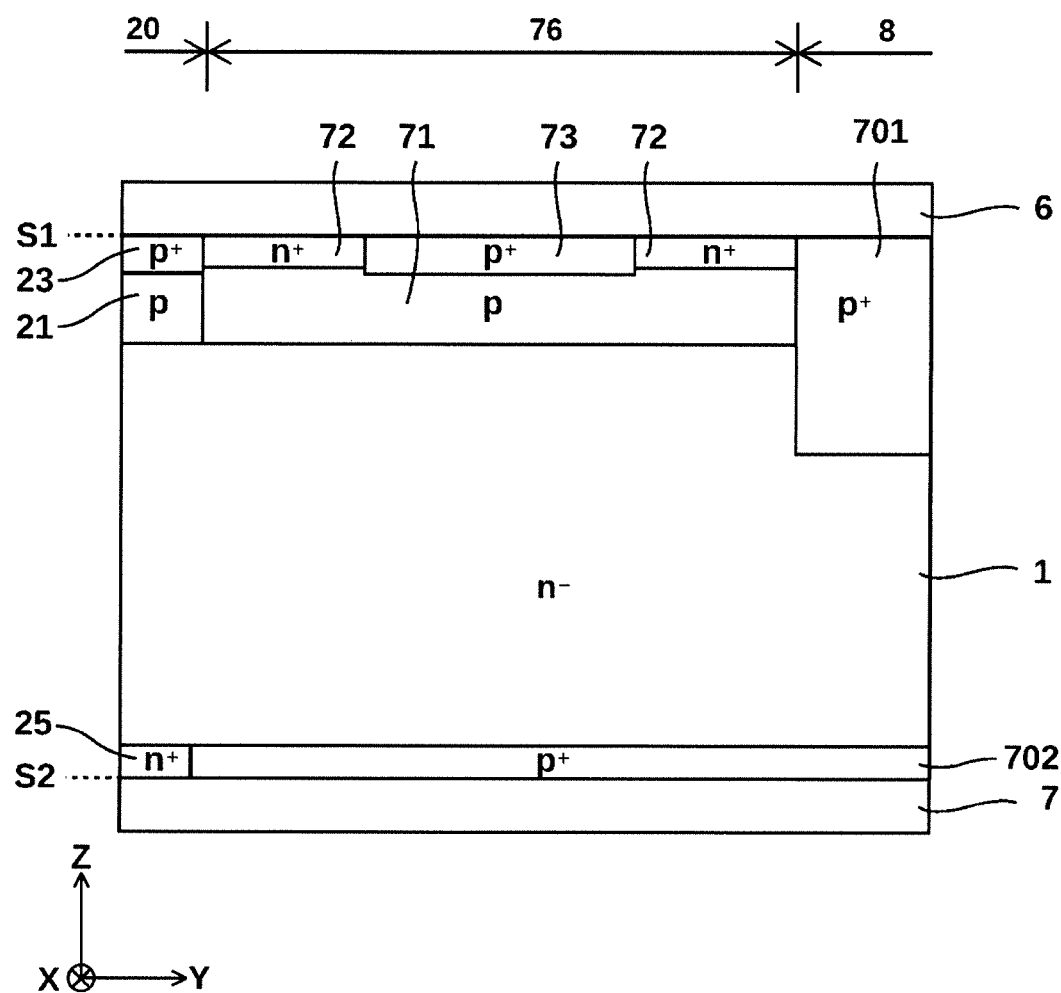
FIG. 32 is a cross-sectional view showing the semiconductor device according to the seventh preferred embodiment.

The configuration of the semiconductor device according to a seventh preferred embodiment will be described with reference to FIGS. 30 to 32. FIGS. 30 and 31 are plan views each showing a semiconductor device according to the seventh preferred embodiment. FIG. 31 is an enlarged view of an R part shown in FIG. 30, and is a plan view showing the structure on the first main surface side of the semiconductor substrate. In FIG. 31, the illustration of the electrode and the like provided above the first main surface of the semiconductor substrate is omitted. FIG. 32 is a cross-sectional view showing a semiconductor device according to the seventh preferred embodiment. FIG. 32 is a cross-sectional view taken along line S-S shown in FIG. 31. For convenience of illustration, FIGS. 30 to 32 also show XYZ orthogonal coordinate axes indicating directions. It should be noted that in the seventh preferred embodiment, the same components as those described in the first preferred embodiment to the sixth preferred embodiment are denoted by the same reference numerals, and its description will be omitted.

In the seventh preferred embodiment, a semiconductor device having a third boundary region between the gate signal receiving region and the diode region will be described.

As shown in FIG. 30, the semiconductor device 700 according to the seventh preferred embodiment includes, in a plan view, an insulated gate bipolar transistor region 10, a diode region 20, a boundary region 70, and a boundary region 75, and further includes a boundary region 76 between the gate signal receiving region 8 and the diode region 20. The gate signal receiving region 8 is a region in which the gate signal receiving pad is arranged on the first main surface. The boundary region 76 is arranged adjacent to the diode region 20 and the boundary region 70 in the Y direction, that is, in the direction orthogonal to the direction in which a plurality of gate electrodes 4a and 4d are arranged side by side.

As shown in FIG. 31, the boundary region 76 is provided over a plurality of gate electrodes 4b. In the boundary region 76, a carrier injection suppression layer 72 and a boundary portion contact layer 73 are provided in the surface layer of the semiconductor substrate between the adjacent gate electrodes 4b.

A p-type gate signal receiving portion well layer 701 having a higher acceptor concentration than the boundary portion semiconductor layer 71 is arranged in the surface layer of the semiconductor substrate in the gate signal receiving region 8. The end portions of the trenches 2b, 2c, and 2d are covered with the gate signal receiving portion well layer 701.

As shown in FIG. 32, in a depth from the first main surface S1 toward the second main surface S2, the gate signal receiving portion well layer 701 is provided up to a position deeper than that of the boundary portion semiconductor layer 71. Providing the gate signal receiving portion well layer 701 up to a deep position allows the concentration of the electric field generated in the gate signal receiving region 8 to be suppressed. A p-type gate signal portion second conductivity type semiconductor layer 702 having a higher acceptor concentration than the boundary portion semiconductor layer 71 is provided in the surface layer on the second main surface S2 side of the termination region 9. The gate signal portion second conductivity type semiconductor layer 702 is provided to protrude from the gate signal receiving region 8 to the boundary region 76. The gate signal portion second conductivity type semiconductor layer 702 may be formed with the same acceptor and the same injection volume as the collector layer 14 shown in FIG. 3. In that case, the acceptor may be injected into the gate signal portion second conductivity type semiconductor layer 702 and the collector layer 14 at the same time, and the impurity concentration distribution of the gate signal portion second conductivity type semiconductor layer 702 in the depth direction from the second main surface S2 toward the first main surface S1 is the same as that of the collector layer 14.

The effect of improving the breakdown tolerance during the recovery operation of the semiconductor device according to the seventh preferred embodiment will be described.

Figure 33:
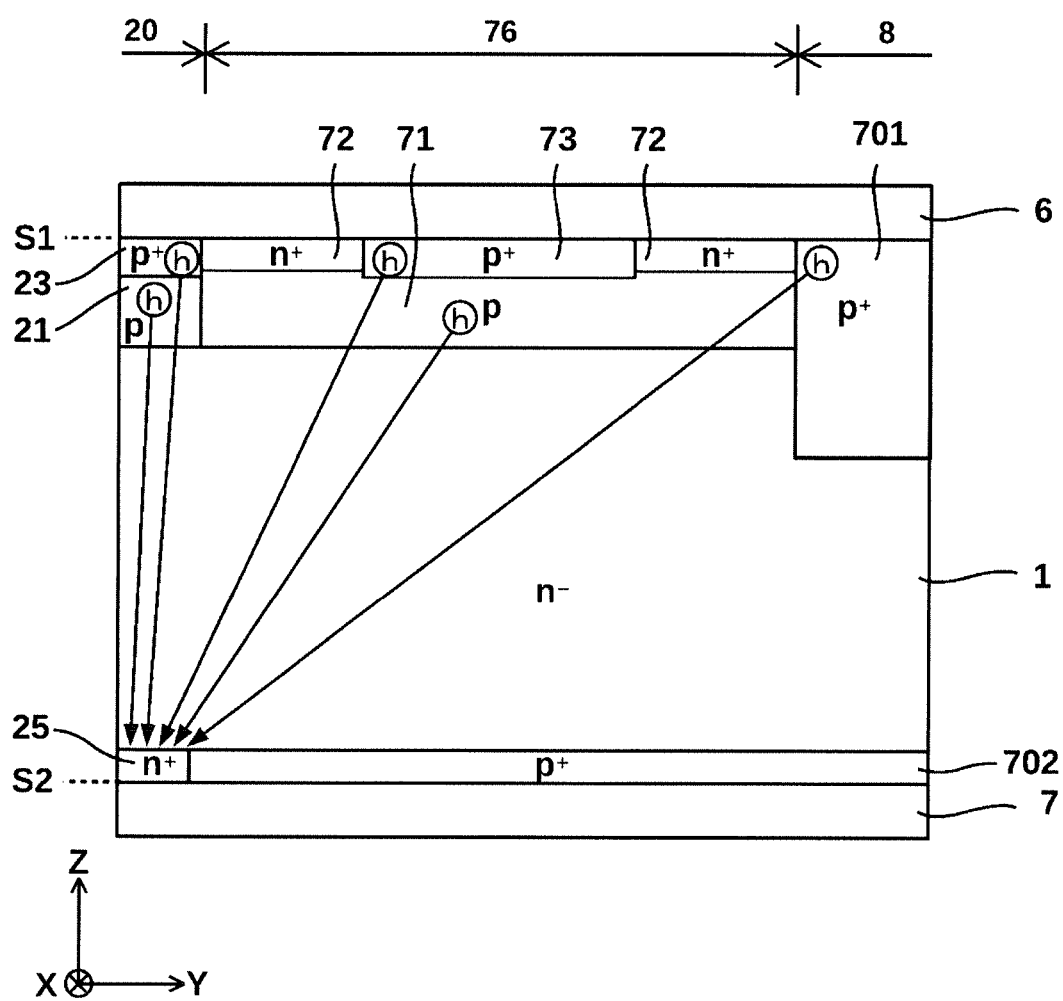
FIG. 33 is a diagram schematically showing movement of holes during reflux operation of the semiconductor device according to the seventh preferred embodiment.

FIG. 33 is a diagram schematically showing movement of holes during reflux operation of the semiconductor device according to the seventh preferred embodiment. FIG. 33 is a diagram schematically showing the movement of the holes during the reflux operation in the cross-sectional view taken along line S-S in FIG. 31. During the reflux operation, holes h are injected into the drift layer 1 from the gate signal receiving portion well layer 701, the boundary portion semiconductor layer 71, the boundary portion contact layer 73, the anode layer 21, and the anode contact layer 23, which are p-type semiconductor layers, and the holes h injected into the drift layer 1 move toward the cathode layer 25. The diode region 20 near the boundary with the boundary region 76 is in a state of having a high density of holes h as compared with the diode region 20 away from the boundary region 76 because the holes h flow in also from the gate signal receiving region 8 and the boundary region 76.

Figure 34:
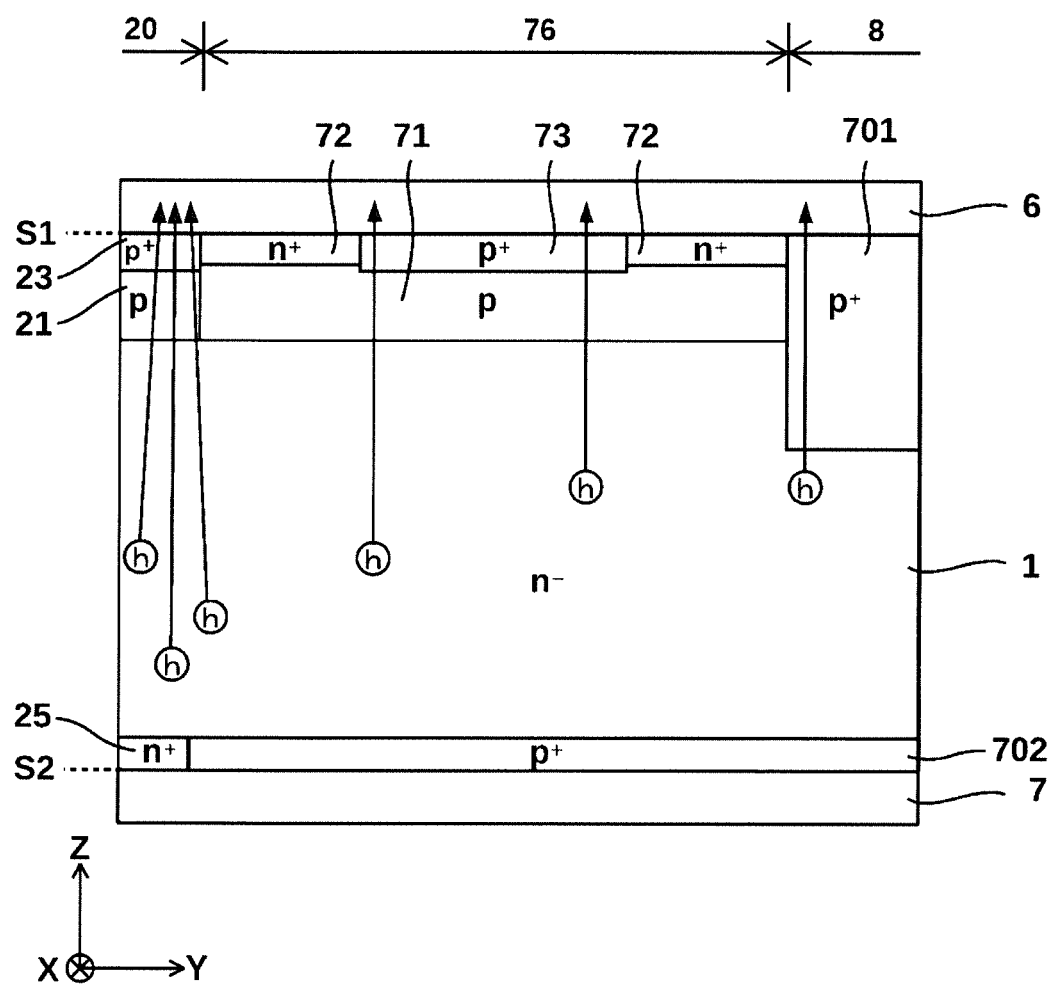
FIG. 34 is a diagram schematically showing movement of holes during recovery operation of the semiconductor device according to the seventh preferred embodiment.

The recovery operation of the semiconductor device according to the seventh preferred embodiment will be described. FIG. 34 is a diagram schematically showing movement of holes during recovery operation of the semiconductor device according to the seventh preferred embodiment. FIG. 34 is a diagram schematically showing the movement of the holes during the recovery operation in the cross-sectional view taken along line S-S in FIG. 31. The holes h having moved toward the cathode layer 25 during the reflux operation move to change the moving direction toward the anode layer 21. As compared with through the anode layer 21 and anode contact layer 23 in the diode region away from the boundary region 76, more holes h pass through the anode layer 21 and the anode contact layer 23 of the diode region 20 near the boundary with the boundary region 76 where the density of the hole has been high during the reflux operation. In addition, some of the holes h existing in the gate signal receiving region 8 flow out to the outside of the semiconductor device via the gate signal receiving portion well layer 701 and the first electrode 6, and some of the holes h existing in the boundary region 76 flow out to the outside of the semiconductor device via the boundary portion semiconductor layer 71, the boundary portion contact layer 73, and the first electrode 6.

The effect of hole injection suppression of the semiconductor device according to the seventh preferred embodiment will be described with reference to FIG. 33.

In the semiconductor device according to the seventh preferred embodiment, the gate signal portion second conductivity type semiconductor layer 702 protrudes from the gate signal receiving region 8 to the boundary region 76. Therefore, it is possible to arrange the gate signal receiving portion well layer 701 away from the cathode layer 25, and it is possible to suppress the holes h flowing from the gate signal receiving region 8 into the diode region 20.

In addition, an n-type carrier injection suppression layer 72 is provided in the surface layer of the boundary portion semiconductor layer 71 of the boundary region 76. Since the carrier injection suppression layer 72 is the n-type, it does not inject holes h toward the cathode layer 25 during the reflux operation. Therefore, the holes h flowing from the boundary region 76 into the diode region 20 can be suppressed.

From the above, in the semiconductor device according to the seventh preferred embodiment, it is possible to suppress the holes flowing from the gate signal receiving region 8 into the diode region 20 and, during the recovery operation, improve the breakdown tolerance.

It should be noted that in the semiconductor device according to the seventh preferred embodiment, the structure in which the boundary region 70 is provided between the diode region 20 and the insulated gate bipolar transistor region 10 is shown, but when miniaturization of semiconductor devices is prioritized, or when the ratio of holes flowing into the diode region 20 is larger from the gate signal receiving region 8 than from the insulated gate bipolar transistor region 10, the structure of omitting the boundary region 70 provided between the diode region 20 and the insulated gate bipolar transistor region may be used. Similarly, when the ratio of holes flowing into the diode region 20 is larger from the gate signal receiving region 8 than from the termination region 9, the structure of omitting the boundary region 75 provided between the diode region 20 and the termination region 9 may be used.

Although some preferred embodiments of the present disclosure have been described, these preferred embodiments are presented as examples. Various omissions, replacements, and changes can be made without departing from the gist. In addition, each preferred embodiment can be combined.

While the disclosure has been shown and described in detail, the foregoing description is in all aspects illustrative and not restrictive. It is therefore understood that numerous modifications and variations can be devised.

What is claimed is:

1. A semiconductor device comprising:
    a semiconductor substrate including a drift layer of a first conductivity type between a first main surface and a second main surface facing the first main surface;
    a hole injection region including:
        a hole injection layer of a second conductivity type provided in a surface layer on the first main surface side of the semiconductor substrate, and
        a semiconductor layer of the second conductivity type provided in a surface layer on the second main surface side;
    a diode region including:
        an anode layer of the second conductivity type provided in the surface layer on the first main surface side of the semiconductor substrate,
        an anode contact layer of the second conductivity type selectively provided in the surface layer on the first main surface side of the anode layer, the anode contact layer having a higher impurity concentration than the anode layer, and
        a cathode layer of the first conductivity type provided in the surface layer on the second main surface side of the semiconductor substrate,
        the diode region having no semiconductor layer of the first conductivity type between the second main surface side of the anode layer and the first main surface, and
        the hole injection region and the diode region being not directly arranged adjacent to each other;
    a boundary region including:
        a boundary portion semiconductor layer of the second conductivity type provided between the diode region and the hole injection region, the boundary portion semiconductor layer provided in the surface layer on the first main surface side of the semiconductor substrate,
        a carrier injection suppression layer of the first conductivity type provided in a surface layer of the boundary portion semiconductor layer and extending to the first main surface,
        a boundary portion contact layer of the second conductivity type provided in the surface layer of the boundary portion semiconductor layer, the boundary portion contact layer having a higher impurity concentration than the boundary portion semiconductor layer,
        an electrode on and connected to the carrier injection suppression layer and the boundary portion contact layer, and
        the semiconductor layer of the second conductivity type provided in the surface layer on the second main surface side is provided to protrude from the hole injection region in the surface layer on the second main surface side of the semiconductor substrate; and
    a boundary dummy gate electrode provided on the first main surface side of the semiconductor substrate between the diode region and the boundary region, the boundary dummy gate electrode facing the boundary portion semiconductor layer and the drift layer via a gate insulating film, the boundary dummy gate electrode to which no gate driving voltage is applied.

2. The semiconductor device according to claim 1, wherein
    the hole injection region includes the hole injection layer of the second conductivity type as a base layer of the second conductivity type, and the semiconductor layer of the second conductivity type as a collector layer of the second conductivity type, and
    the hole injection region is an insulated gate bipolar transistor region including:
        an emitter layer of the first conductivity type selectively provided in a surface layer on the first main surface side of the base layer, and
        a gate electrode provided on the first main surface side of the semiconductor substrate, a plurality of the gate electrodes arranged side by side in a direction along the first main surface, the gate electrode facing the emitter layer, the base layer, and the drift layer via the gate insulating film.

3. The semiconductor device according to claim 2, wherein
    the gate electrode includes a plurality of gate electrodes, and
    a width of the boundary region is larger than a distance between the gate electrodes adjacent to each other in the insulated gate bipolar transistor region.

4. The semiconductor device according to claim 2, wherein an impurity concentration distribution of the first conductivity type in a depth direction from the first main surface toward the second main surface is a same in the emitter layer and the carrier injection suppression layer.

5. The semiconductor device according to claim 2, wherein an impurity concentration of the second conductivity type of the boundary portion semiconductor layer is lower than an impurity concentration of the second conductivity type of the base layer.

6. The semiconductor device according to claim 2, wherein an impurity concentration of the second conductivity type of the anode layer is lower than an impurity concentration of the second conductivity type of the base layer.

7. The semiconductor device according to claim 1, wherein
    in the boundary region, one or more first dummy gate electrodes are arranged side by side in a direction along the first main surface on the first main surface side of the semiconductor substrate and each of the one or more first dummy gate electrodes is not applied with the gate driving voltage,
    in the diode region, a plurality of second dummy gate electrodes are provided on the first main surface side of the semiconductor substrate and arranged side by side in the direction along the first main surface, each of the plurality of second dummy gate electrodes faces the anode layer and the drift layer via the gate insulating film, and is not applied with the gate driving voltage.

* * * * *